(12) United States Patent
Hashiguchi

(10) Patent No.: US 12,548,691 B2
(45) Date of Patent: Feb. 10, 2026

(54) CABLE CONNECTION COMPONENT AND CABLE STRUCTURE

(71) Applicant: Japan Aviation Electronics Industry, Limited, Tokyo (JP)

(72) Inventor: Osamu Hashiguchi, Tokyo (JP)

(73) Assignee: JAPAN AVIATION ELECTRONICS INDUSTRY, LIMITED, Tokyo (JP)

(*) Notice: Subject to any disclaimer, the term of this patent is extended or adjusted under 35 U.S.C. 154(b) by 132 days.

(21) Appl. No.: 18/474,500

(22) Filed: Sep. 26, 2023

(65) Prior Publication Data

US 2024/0194373 A1    Jun. 13, 2024

(30) Foreign Application Priority Data

Dec. 8, 2022 (JP) .................. 2022-196348

(51) Int. Cl.
| | | |
|---|---|---|
| *H01R 12/62* | (2011.01) | |
| *H01B 7/00* | (2006.01) | |
| *H01B 7/40* | (2006.01) | |
| *H01R 12/58* | (2011.01) | |

(52) U.S. Cl.
CPC ............ *H01B 7/0045* (2013.01); *H01B 7/40* (2013.01); *H01R 12/58* (2013.01)

(58) Field of Classification Search
CPC ......... H01B 7/0853; H01R 4/28; H01R 12/62
See application file for complete search history.

(56) References Cited

U.S. PATENT DOCUMENTS

| | | | |
|---|---|---|---|
| 2022/0302615 A1* | 9/2022 | Agawa | .................. H05K 3/325 |
| 2023/0113196 A1* | 4/2023 | Takeuchi | ............. H01R 13/426 439/417 |

FOREIGN PATENT DOCUMENTS

JP            6513439 B        5/2019

* cited by examiner

*Primary Examiner* — Chau N Nguyen
(74) *Attorney, Agent, or Firm* — MUNCY, GEISSLER, OLDS & LOWE, P.C.

(57) ABSTRACT

The cable connection component includes a locator extending in the alignment direction, a plurality of first restriction portions disposed in the locator and separately restricting movements, at least in the alignment direction, of tip ends in an extension direction of the plurality of cables, and a plurality of second restriction portions disposed in the locator and separately restricting movements, at least in the alignment direction, of the plurality of cables at positions on a proximal side of the plurality of cables away from the tip ends of the plurality of cables along the extension direction by a predetermined distance, and the plurality of conductor portions exposed from the plurality of cables between the plurality of first restriction portions and the plurality of second restriction portions are soldered to the plurality of connection portions of the substrate.

10 Claims, 17 Drawing Sheets

CABLE CONNECTION COMPONENT AND CABLE STRUCTURE

BACKGROUND OF THE INVENTION

The present invention relates to a cable connection component, particularly to a cable connection component that is used for connecting a plurality of cables to a substrate.

The present invention also relates to a cable structure in which a plurality of cables are connected to a substrate.

As a cable structure in which a plurality of cables are electrically connected to a substrate, for instance, JP 6513439 B discloses a cable structure as shown in FIG. 39. A plurality of cables 1 are aligned along a surface of a substrate 2. Each cable 1 has a structure in which an outer periphery of a conductor portion 3 is covered with an insulating coating portion 4, and the insulating coating portion 4 is partly peeled off on the rear side of a front end portion 5 of the cable 1, whereby an exposure portion 6 in which the conductor portion 3 is exposed is formed. When each conductor portion 3 exposed at the exposure portion 6 is soldered to a corresponding connection pad 8 of the substrate 2 with solder 7, the cables 1 are electrically connected to the substrate 2.

The cable structure as above can be produced by, for example, bonding the cables 1 to one another with an adhesive while being aligned, and, in each cable 1, forming the exposure portion 6 at which the conductor portion 3 is partly exposed with use of a cutting tool or laser, followed by a process of soldering the conductor portion 3 at the exposure portion 6 to the corresponding connection pad 8 of the substrate 2.

In the cable structure of JP 6513439 B, however, while the cables 1 are aligned and bonded to each other with an adhesive, in the exposure portions 6 at which the conductor portions 3 of the cables 1 are exposed, the conductor portion 3 of each cable 1 can freely move, and there is no means for restricting positions of each cable 1 on the tip end side and the root portion side of the exposure portion 6. Therefore, the conductor portion 3 is easily misaligned with respect to the corresponding connection pad 8 during the process of soldering the conductor portion 3 of the cable 1 to the connection pad 8 of the substrate 2, disadvantageously. When the conductor portion 3 is misaligned with respect to the connection pad 8, reliability in electrical connection between the conductor portions 3 of the cables 1 and the connection pads 8 of the substrate 2 may be impaired.

SUMMARY OF THE INVENTION

The present invention has been made to overcome the conventional problems as above and aims at providing a cable connection component that enables connection of a plurality of cables to a plurality of connection portions, while preventing misalignment of the cables with respect to the connection portions of the substrate.

The present invention also aims at providing a cable structure in which a plurality of cables are connected to a plurality of connection portions of a substrate without occurrence of misalignment therebetween.

Solution to Problems

The cable connection component according to the present invention is a cable connection component for soldering a plurality of cables to a plurality of connection portions of a substrate, the plurality of cables being aligned in a predetermined alignment direction and having conductor portions whose outer peripheries are separately covered with insulating coating portions; the cable connection component comprising:
a locator extending in the alignment direction;
a plurality of first restriction portions disposed in the locator and separately restricting movements, at least in the alignment direction, of tip ends in an extension direction of the plurality of cables; and
a plurality of second restriction portions disposed in the locator and separately restricting movements, at least in the alignment direction, of the plurality of cables at positions on a proximal side of the plurality of cables away from the tip ends of the plurality of cables along the extension direction by a predetermined distance,
wherein the plurality of conductor portions exposed from the plurality of cables between the plurality of first restriction portions and the plurality of second restriction portions are soldered to the plurality of connection portions of the substrate.

The cable structure according to the present invention comprises:
a plurality of cables aligned in a predetermined alignment direction and having conductor portions whose outer peripheries are separately covered with insulating coating portions;
a substrate including a plurality of connection portions aligned in the alignment direction; and
the above-described cable connection component,
wherein the plurality of conductor portions exposed from the plurality of cables between the plurality of first restriction portions and the plurality of second restriction portions are soldered to the plurality of connection portions of the substrate.

DETAILED DESCRIPTION OF THE INVENTION

Embodiments of the present invention are described below based on the accompanying drawings.

Embodiment 1

Figure 1:
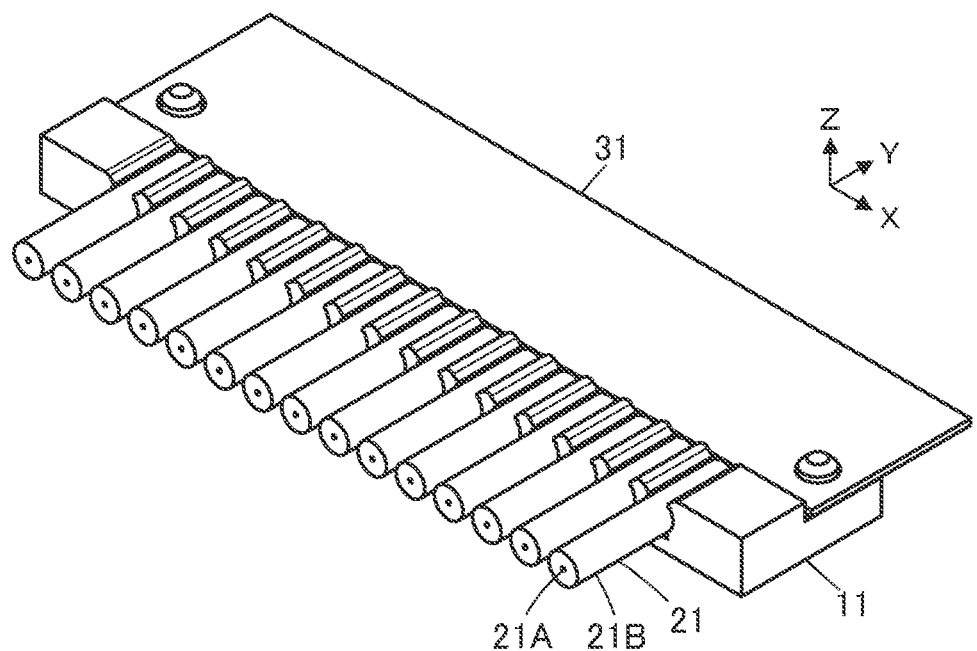
FIG. 1 is a perspective view showing a cable structure according to Embodiment 1.

FIG. 1 shows a cable structure according to Embodiment 1. The cable structure is configured such that a plurality of cables 21 are connected to a sheet type substrate 31 using a cable connection component 11.

The cables 21 are aligned in a predetermined alignment direction and each extend in a direction perpendicular to the alignment direction in parallel to a surface of the substrate 31. Each cable 21 has a structure in which an outer periphery of a conductor portion 21A is covered with an insulating coating portion 21B. By use of the cable connection component 11, the conductor portions 21A of the cables 21 are electrically connected to a plurality of connection portions to be described later of the substrate 31. The conductor portion 21A of the cable 21 may be either a so-called solid wire constituted of one conductor or a so-called stranded wire constituted of plural conductors being stranded.

The cable connection component 11 extends along the alignment direction of the cables 21.

For convenience, the substrate 31 is defined as extending along an XY plane, the alignment direction of the cables 21 is referred to as "X direction," the direction in which each cable 21 extends toward the cable connection component 11 is referred to as "+Y direction," and the direction perpendicular to an XY plane is referred to as "Z direction."

Figure 2:
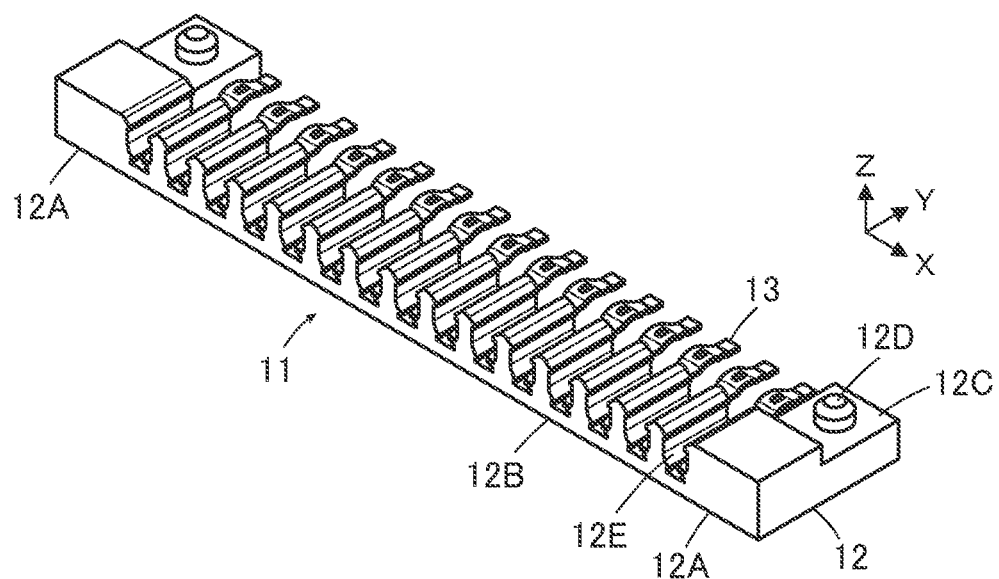
FIG. 2 is a perspective view showing a cable connection component used in Embodiment 1.

As shown in FIG. 2, the cable connection component 11 includes a locator 12 extending in the X direction and made of an insulating resin, and a plurality of metal terminals 13 attached to the locator 12.

The locator 12 includes a pair of support members 12A disposed at opposite ends in the X direction of the locator 12, and a second beam 12B extending in the X direction and joining the pair of support members 12A to each other.

The pair of support members 12A each include a substrate-mounting surface 12C extending along an XY plane and facing in the +Z direction, and a boss 12D is formed in a center part of the substrate-mounting surface 12C to project in the +Z direction.

The second beam 12B is provided with a plurality of second insertion grooves 12E aligned in the X direction and each opened toward the +Z direction. The second insertion grooves 12E correspond to the cables 21, each have a groove width and a groove depth that allow insertion of the insulating coating portion 21B of the cable 21, and is configured to be capable of restricting movement, at least in the X direction, of the cable 21 inserted in the second insertion groove 12E.

Figure 3:
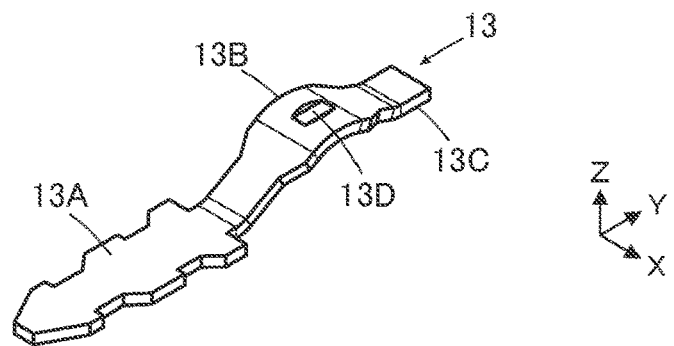
FIG. 3 is a perspective view showing a metal terminal of the cable connection component used in Embodiment 1.

The metal terminals 13 correspond to the cables 21 and the second insertion grooves 12E, and as shown in FIG. 3, a fixing portion 13A of flat plate shape is formed at the −Y directional end of each metal terminal 13. To the +Y directional end of the fixing portion 13A, a curved portion 13B that is curved so as to protrude toward the +Z direction is joined, and a heated portion 13C of flat plate shape is formed to be joined to the curved portion 13B at the +Y directional end of the metal terminal 13.

The fixing portion 13A is retained at the bottom part of the corresponding second insertion groove 12E of the second beam 12B of the locator 12 through press fitting or insertion molding, whereby the metal terminal 13 is fixed to the second beam 12B.

In the +Z directional surface of a top part of the curved portion 13B, a conductor portion insertion groove 13D is formed along the Y direction. The conductor portion insertion groove 13D has a groove width that allows insertion of the conductor portion 21A of the cable 21; when the conductor portion 21A drawn and exposed from the corresponding cable 21 is inserted in the conductor portion insertion groove 13D, movement of the conductor portion 21A in the X direction is restricted.

Figure 4:
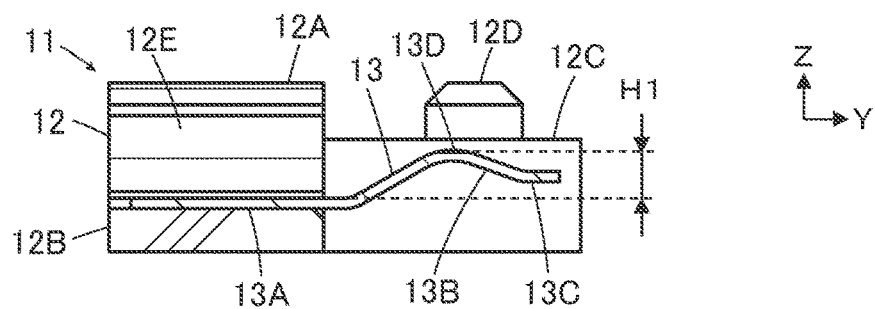
FIG. 4 is a cross-sectional view showing the cable connection component used in Embodiment 1.

As shown in FIG. 4, the metal terminal 13 has a so-called cantilever shape extending in the +Y direction from the corresponding second insertion groove 12E of the second beam 12B, and there is a predetermined height difference in the Z direction between the curved portion 13B and the fixing portion 13A. Specifically, between the +Z directional surface of the fixing portion 13A fixed to the bottom part of the second insertion groove 12E of the second beam 12B and a bottom surface of the conductor portion insertion groove 13D formed at the top part of the curved portion 13B, provided is a height difference H1 corresponding to the thickness of the insulating coating portion 21B of the cable 21.

In addition, the heated portion 13C disposed on the +Y direction side of the curved portion 13B of the metal terminal 13 is deviated to the +Z direction side from the fixing portion 13A and is brought into contact with and heated by a heating portion of a heater (not shown) in the assembling operation of the cable structure, whereby the conductor portion 21A of the cable 21 inserted in the conductor portion insertion groove 13D is soldered to the connection portion of the substrate 31.

Figure 5:
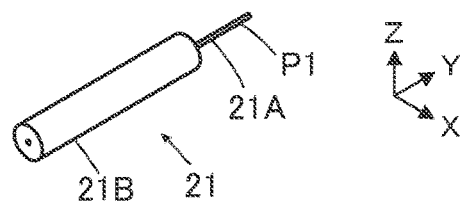
FIG. 5 is a perspective view showing a cable used in Embodiment 1.

As shown in FIG. 5, at the +Y directional end of the cable 21, formed is a conductor-exposed portion P1 in which the insulating coating portion 21B in a predetermined length is removed to thereby expose the conductor portion 21A.

In the cable connection component 11 shown in FIG. 4, the conductor portion insertion grooves 13D of the metal terminals 13 constitute a plurality of first restriction portions that separately restrict movements, at least in the X direction, of the conductor portions 21A exposed at the +Y directional tip ends of the cables 21, and the second insertion grooves 12E of the second beam 12B of the locator 12 constitute a plurality of second restriction portions that separately restrict movements, at least in the X direction, of the insulating coating portions 21B of the cables 21 at positions away from the tip ends of the cables 21 in the −Y direction, i.e., on the proximal side of the cables 21, by a predetermined distance.

Figure 6:
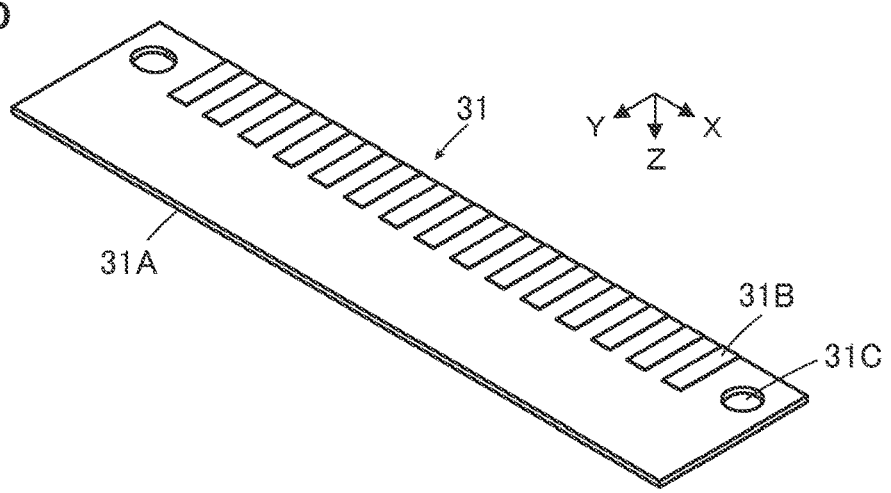
FIG. 6 is a perspective view showing a substrate used in Embodiment 1 when viewed from an obliquely lower position.

As shown in FIG. 6, the substrate 31 is formed of, for example, a so-called flexible printed circuit (FPC), includes a sheet body 31A made of an insulating material, and has a plurality of connection portions 31B exposed on the −Z directional surface of the sheet body 31A, the connection portions 31B being aligned in the X direction along the −Y directional edge of the substrate 31 and each formed of a flexible conductor. The connection portions 31B correspond to the cables 21 and the metal terminals 13.

The substrate 31 is not limited to a FPC but may be a so-called printed circuit board or another rigid substrate having no flexibility.

In the opposite end portions in the X direction of the substrate 31, formed are a pair of through holes 31C corresponding to a pair of the bosses 12D of the locator 12.

Figure 7:
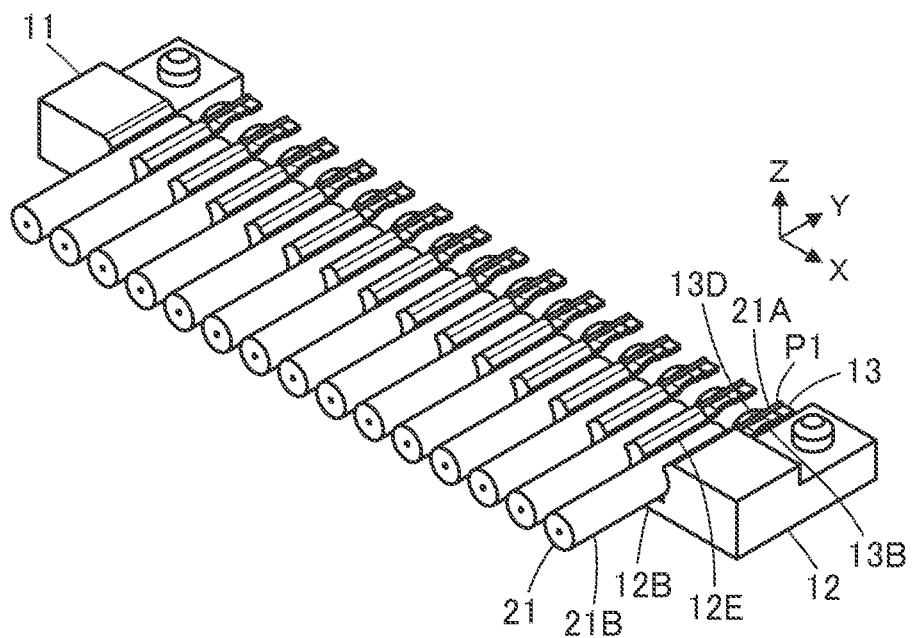
FIG. 7 is a perspective view showing the cable connection component on which a plurality of cables are disposed in Embodiment 1.

In the assembling operation of the cable structure, first, the cables 21 are disposed on the locator 12 of the cable connection component 11 as shown in FIG. 7. In this process, the insulating coating portion 21B of each cable 21 is inserted in the corresponding second insertion groove 12E of the locator 12, the conductor portion 21A of the conductor-exposed portion P1 at the +Y directional end of the cable 21 is situated on the +Z direction side of the curved portion 13B of the corresponding metal terminal 13, and part of the conductor portion 21A is inserted in the conductor portion insertion groove 13D of the curved portion 13B.

That is, the conductor portions 21A exposed at the +Y directional tip ends of the cables 21 are separately inserted in the conductor portion insertion grooves 13D (first restriction portions) of the corresponding metal terminals 13, and the insulating coating portions 21B are separately inserted in the corresponding second insertion grooves 12E (second restriction portions) of the second beam 12B at positions away from the +Y directional tip ends of the cables 21 in the −Y direction by the predetermined distance.

Figure 8:
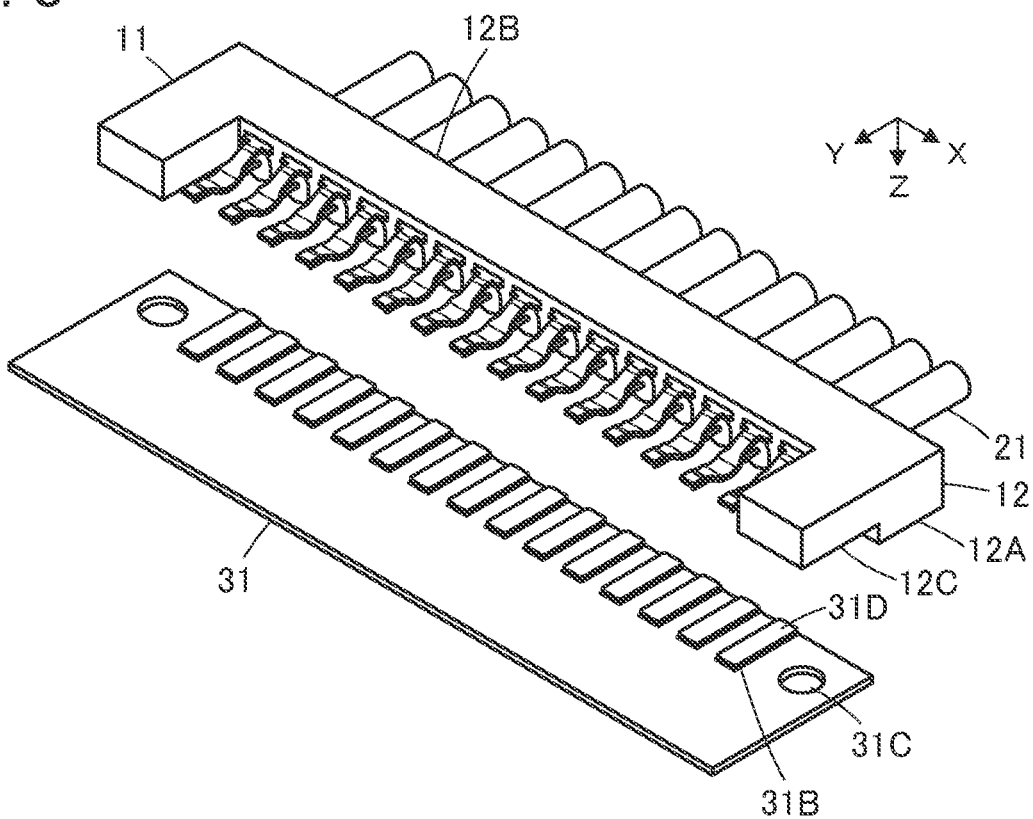
FIG. 8 is a perspective view showing a state where the substrate is positionally aligned with the cable connection component on which the cables are disposed in Embodiment 1.

Next, as shown in FIG. 8, the substrate 31 is disposed on the +Z direction side of the cable connection component 11 on which the cables 21 are disposed. With this constitution, the substrate-mounting surfaces 12C of the pair of support members 12A of the locator 12 are opposed to the −Z directional surface of the substrate 31 on which the connection portions 31B are exposed.

Meanwhile, cream solder 31D is preliminarily printed on the connection portions 31B exposed on the −Z directional surface of the substrate 31.

Figure 9:
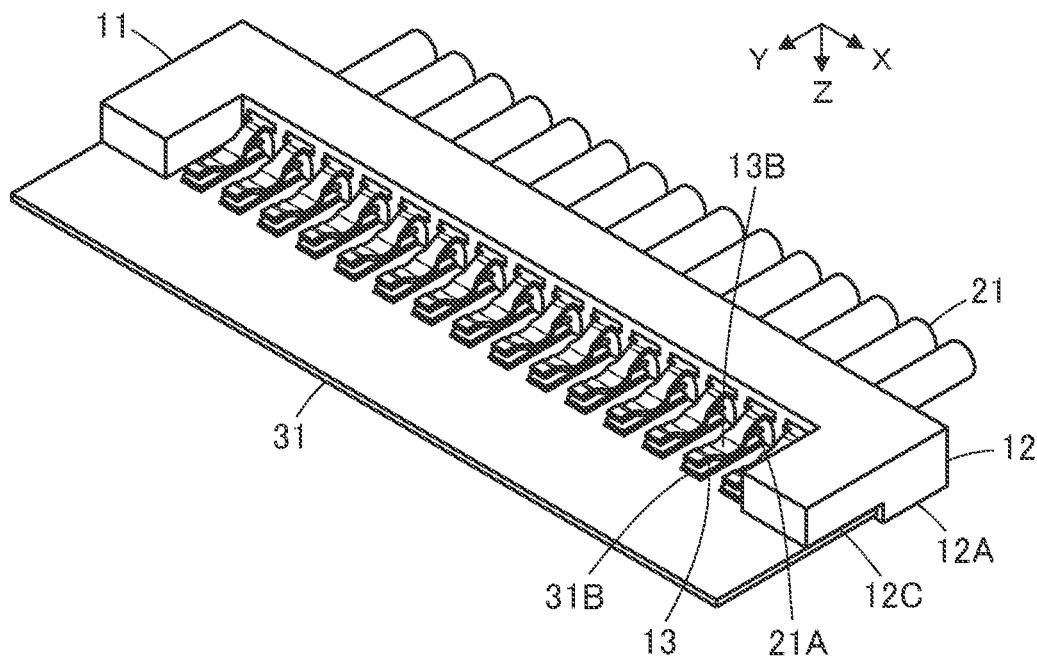
FIG. 9 is a perspective view showing a state where the substrate is disposed to the cable connection component on which the cables are disposed in Embodiment 1.

Further, the substrate 31 and the cable connection component 11 are relatively moved in the Z direction, whereby the substrate 31 is mounted on the substrate-mounting surfaces 12C of the pair of support members 12A of the locator 12 as shown in FIG. 9. At this time, the pair of bosses 12D of the locator 12 shown in FIG. 2 are separately fitted with the pair of through holes 31C of the substrate 31, whereby the substrate 31 is positionally aligned with the cable connection component 11. With this constitution, the conductor portions 21A of the cables 21 disposed on the +Z direction side of the curved portions 13B of the metal terminals 13 of the cable connection component 11 are situated on the −Z direction side of the connection portions 31B of the substrate 31.

Here, the locator 12 is preferably fixed to the substrate 31 by a jig (not shown) such that the metal terminals 13 do not move in the −Z direction relatively to the connection portions 31B of the substrate 31. It is also possible to configure the locator 12 to be fixed to the substrate 31 in the Z direction with the pair of bosses 12D of the locator 12 fitted with the pair of through holes 31C of the substrate 31.

Figure 10:
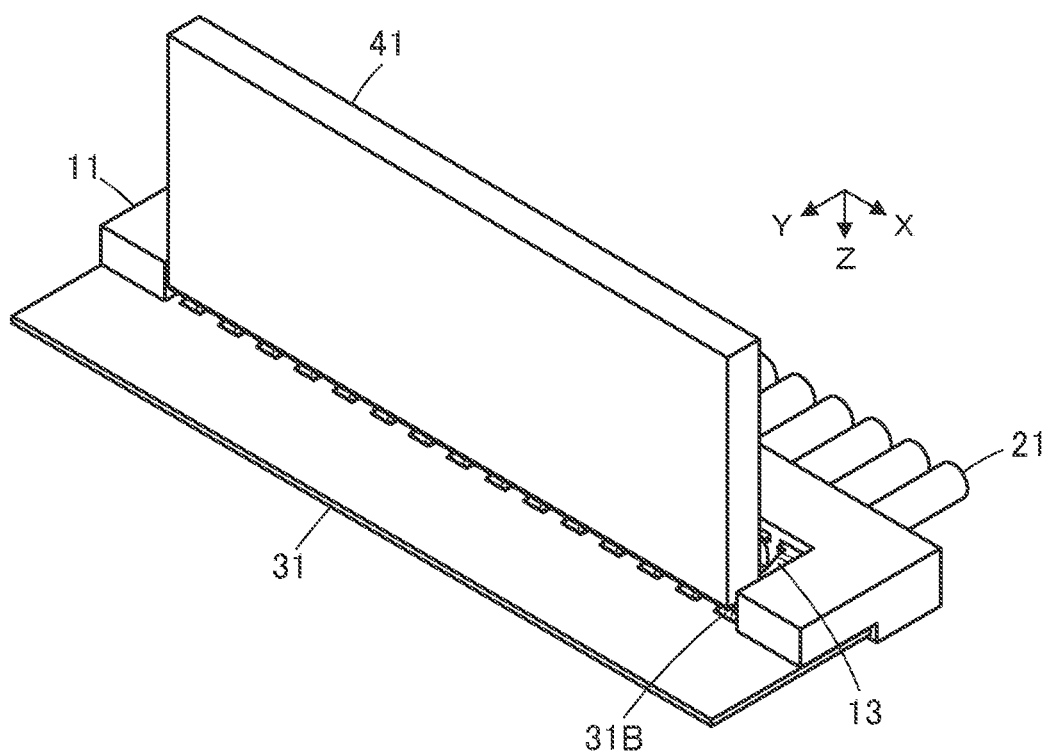
FIG. 10 is a perspective view showing a state where a heater is disposed on the cable connection component to which the cables and the substrate are disposed in Embodiment 1.

In this state, a heater 41 is disposed on the metal terminals 13 from the −Z direction as shown in FIG. 10. As the heater 41, a so-called pulse heat-type heater can be used, for example, and a heating portion (not shown) formed at the +Z directional end of the heater 41 and extending in the X direction is disposed so as to make contact with the metal terminals 13. Meanwhile, the heating portion of the heater 41 makes contact with the heated portion 13C of each metal terminal 13 shown in FIG. 4.

Figure 11:
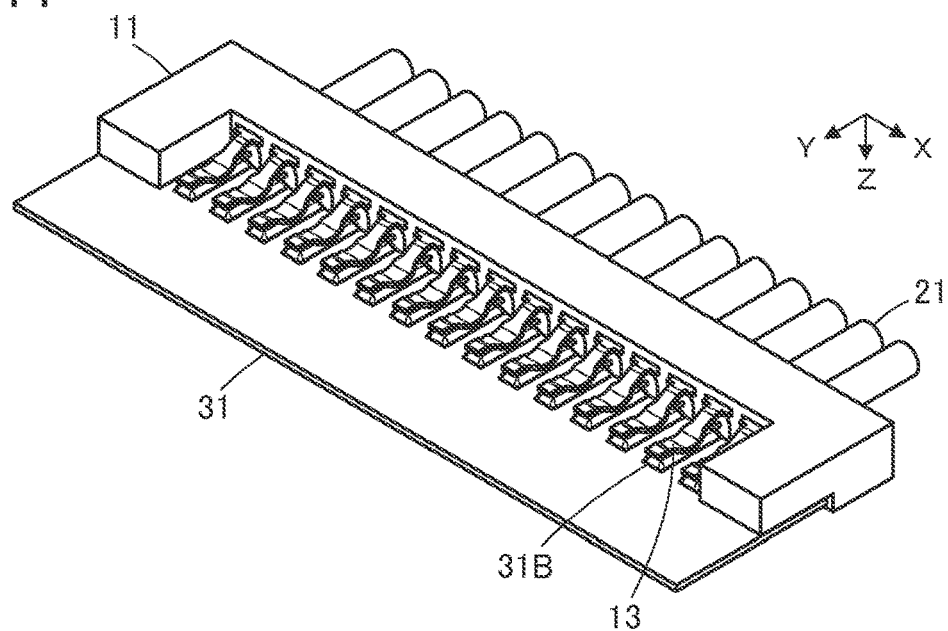
FIG. 11 is a perspective view showing a state where conductor portions of the cables are soldered to the substrate in Embodiment 1.

By applying electric current to the heater 41 from a power source (not shown) connected to the heater 41, the metal terminals 13 in contact with the heating portion are heated, the cream solder 31D printed on the connection portions 31B of the substrate 31 is melted, and the metal terminals 13 are separately soldered to the connection portions 31B of the substrate 31 as shown in FIG. 11.

Figure 12:
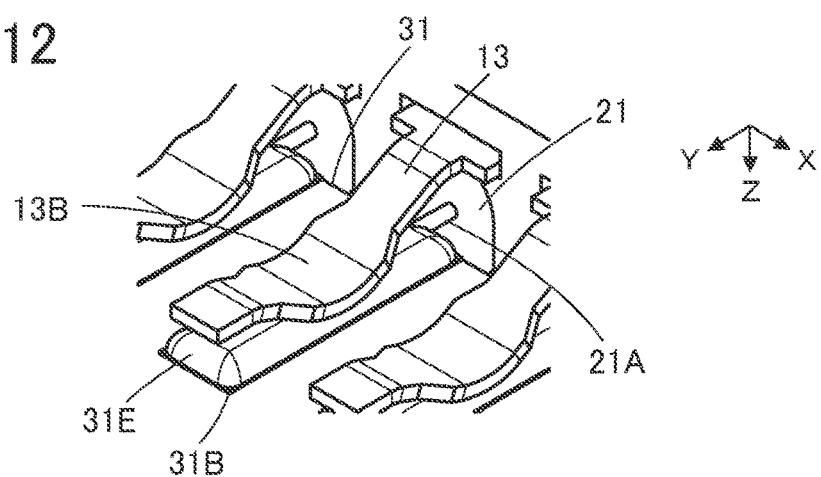
FIG. 12 is an enlarged view of a main part of FIG. 11.

In this process, as shown in FIG. 12, the conductor portion 21A of the cable 21 that is situated between the curved portion 13B of each metal terminal 13 and the corresponding connection portion 31B of the substrate 31, together with the metal terminal 13, is soldered to the connection portion 31B with the solder 31E to be thereby electrically connected to the connection portion 31B.

Thus, the assembling operation of the cable structure is completed.

Figure 13:
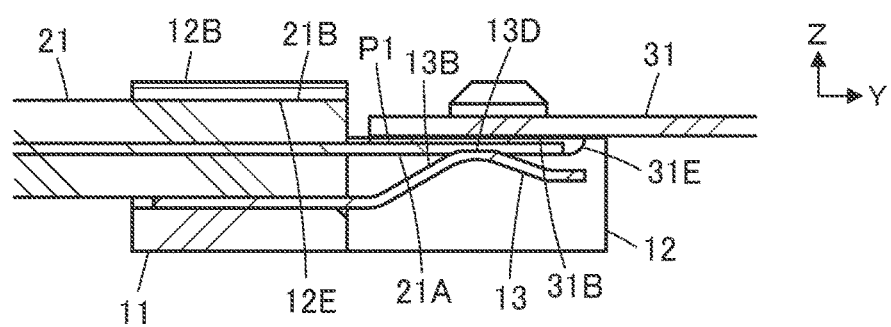
FIG. 13 is a cross-sectional view showing the cable structure according to Embodiment 1.

A cross-sectional view of the thus assembled cable structure is shown in FIG. 13. While the conductor portion 21A exposed at the conductor-exposed portion P1 at the +Y directional tip end of the cable 21 is inserted in the conductor portion insertion groove 13D of the metal terminal 13, and the insulating coating portion 21B is inserted in the second insertion groove 12E of the second beam 12B at a position away from the +Y directional tip end of the cable 21 in the Y direction by the predetermined direction, the conductor portion 21A inserted in the conductor portion insertion groove 13D is electrically connected to the connection portion 31B of the substrate 31 with the solder 31E.

Since the conductor portion 21A of the conductor-exposed portion P1 of the cable 21 is inserted in the conductor portion insertion groove 13D of the curved portion 13B of the metal terminal 13, movement in the X direction of the conductor portion 21A is restricted, and the distance between the top part of the curved portion 13B and the connection portion 31B of the substrate 31 in the Z direction is narrowed, whereby the soldering between the metal terminal 13 and the connection portion 31B is facilitated, compared to the case where the conductor portion insertion groove 13D is not provided. Accordingly, it is possible to electrically connect the conductor portion 21A of the cable 21 to the connection portion 31B of the substrate 31 with high reliability.

As described above, owing to the conductor portion insertion groove 13D of the metal terminal 13 constituting the first restriction portion and the second insertion groove 12E of the second beam 12B constituting the second restriction portion, the conductor portion 21A of the cable 21 is electrically connected to the connection portion 31B of the substrate 31 while movement of the cable 21 at least in the X direction is restricted at two positions separated from each other in the Y direction, whereby the plurality of cables 21 are prevented from misalignment with respect to the plurality of connection portions 31B of the substrate 31 and can be connected to the connection portions 31B.

In addition, since the conductor portion 21A of each cable 21 is connected to the corresponding connection portion 31B of the substrate 31 with use of the metal terminal 13, the plurality of cables 21 can be connected to the substrate 31 with excellent retention strength.

Figure 14:
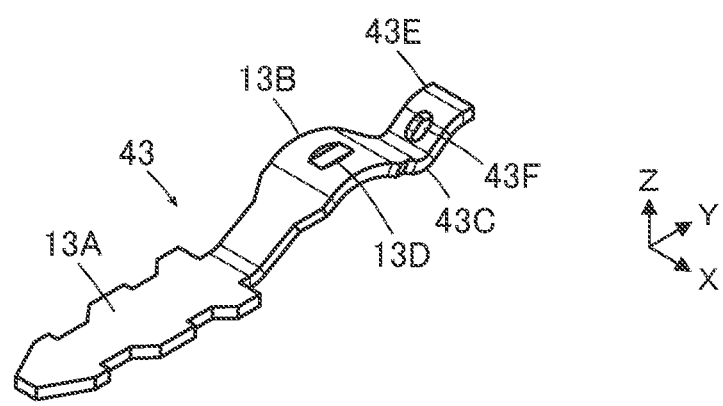
FIG. 14 is a perspective view showing a metal terminal of a cable connection component used in a modification of Embodiment 1.

In place of the metal terminal 13, a metal terminal 43 shown in FIG. 14 may be used. The metal terminal 43 is configured such that, in the metal terminal 13 shown in FIG. 3, in place of the heated portion 13C of flat plate shape, a heated portion 43C that is curved to protrude toward the −Z direction is joined to the +Y directional end of the curved portion 13B, an inclination portion 43E obliquely extends from the heated portion 43C toward the +Y direction and +Z direction, and a conductor portion insertion hole 43F is formed in the inclination portion 43E to penetrate the metal terminal 43.

The conductor portion insertion hole 43F serves as the first restriction portion that restricts movement in the X direction of the +Y directional tip end of the cable 21 when the conductor portion 21A of the cable 21 is passed through the conductor portion insertion hole 43F.

Figure 15:
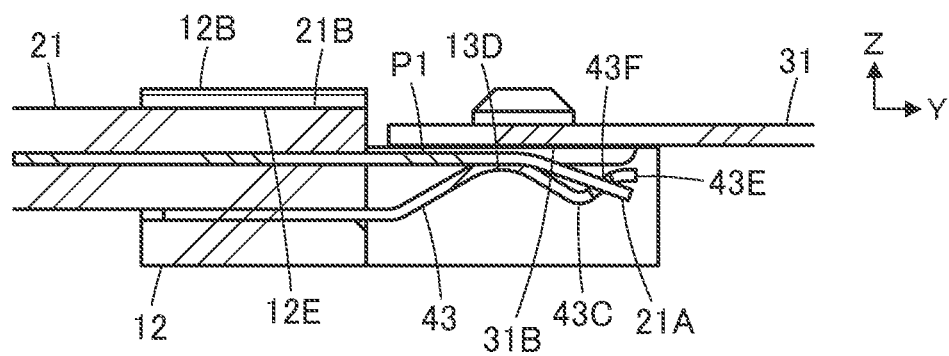
FIG. 15 is a cross-sectional view showing a cable structure according to the modification of Embodiment 1.

As shown in FIG. 15, as with the metal terminal 13 shown in FIG. 3, the metal terminal 43 is fixed to the bottom part of the second insertion groove 12E of the second beam 12B of the locator 12. The insulating coating portion 21B of the cable 21 is inserted in the second insertion groove 12E of the locator 12, the conductor portion 21A of the conductor-exposed portion P1 of the cable 21 is inserted in the conductor portion insertion groove 13D of the curved portion 13B of the metal terminal 43, and the tip end of the conductor portion 21A penetrates the conductor portion insertion hole 43F in the inclination portion 43E of the metal terminal 43; in this state, the metal terminal 43 and the conductor portion 21A are soldered to the connection portion 31B of the substrate 31.

In the soldering process, the heating portion of the heater 41 shown in FIG. 10 makes contact with the heated portion 43C of the metal terminal 43, whereby the metal terminal 43 is heated.

While the conductor portion insertion groove 13D of the curved portion 13B of the metal terminal 13 constitutes the first restriction portion that restricts movement, at least in the X direction, of the conductor portion 21A exposed at the +Y directional tip end of the cable 21 in the cable structure using the metal terminal 13, the conductor portion insertion hole 43F of the inclination portion 43E constitutes the first restriction portion in the metal terminal 43. In the meantime, due to the conductor portion insertion groove 13D of the curved portion 13B, the conductor portion 21A makes contact with the connection portion 31B of the substrate 31 at a proper position, and in addition, the distance in the Z direction between the top part of the curved portion 13B and the connection portion 31B of the substrate 31 is narrowed so that the metal terminal 43 is easily soldered to the connection portion 31B; hence, the reliability in electrical connection between the conductor portion 21A of the cable 21 and the connection portion 31B of the substrate 31 is improved.

With use of the metal terminal 43 as above, similarly, the cables 21 can be connected to the connection portions 31B of the substrate 31 while being prevented from misalignment with respect to the connection portions 31B, and the cables 21 can be connected to the substrate 31 with excellent retention force.

Figure 16:
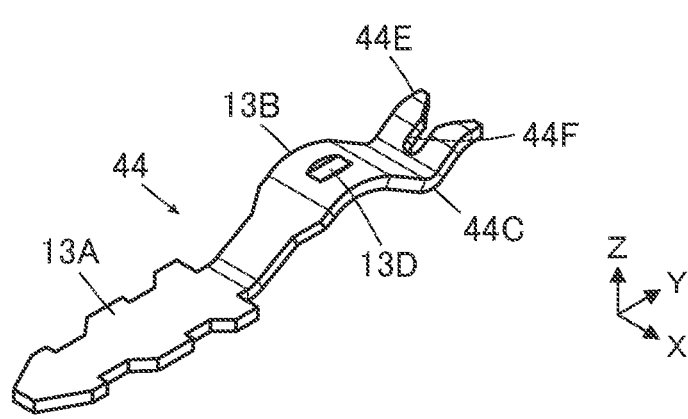
FIG. 16 is a perspective view showing a metal terminal of a cable connection component used in another modification of Embodiment 1.

In addition, a metal terminal 44 shown in FIG. 16 may also be used. In the metal terminal 44, as with the metal terminal 43, a heated portion 44C that is curved to protrude toward the −Z direction is joined to the +Y directional end of the curved portion 13B, an inclination portion 44E obliquely extends from the heated portion 44C toward the +Y direction and +Z direction, and a conductor portion insertion slit 44F is formed in the inclination portion 44E.

The conductor portion insertion slit 44F serves as the first restriction portion that restricts movement in the X direction of the +Y directional end of the cable 21 when the conductor portion 21A of the cable 21 is inserted in the conductor portion insertion slit 44F.

With use of the metal terminal 44 as above, similarly, the cables 21 can be connected to the connection portions 31B of the substrate 31 while being prevented from misalignment with respect to the connection portions 31B, and the cables 21 can be connected to the substrate 31 with excellent retention force.

Embodiment 2

Figure 17:
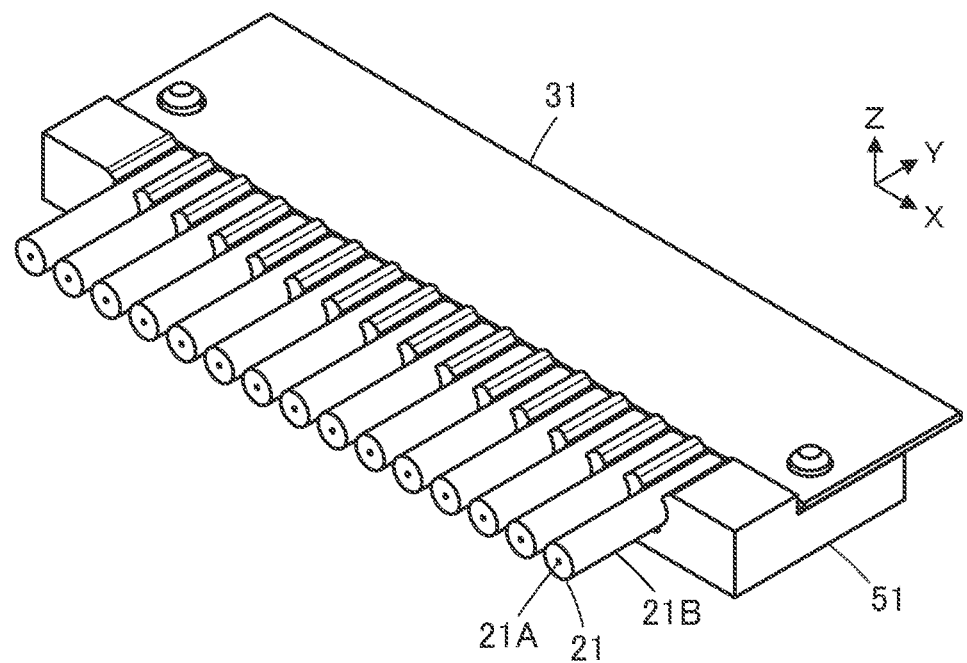
FIG. 17 is a perspective view showing a cable structure according to Embodiment 2.

FIG. 17 shows a cable structure according to Embodiment 2. The cable structure is configured such that, in the cable structure of Embodiment 1, the cables 21 are connected to the sheet type substrate 31 using a cable connection component 51 in place of the cable connection component 11. Each cable 21 has a structure in which an outer periphery of the conductor portion 21A is covered with the insulating coating portion 21B, and the substrate 31 is the same as the one used in Embodiment 1.

Figure 18:
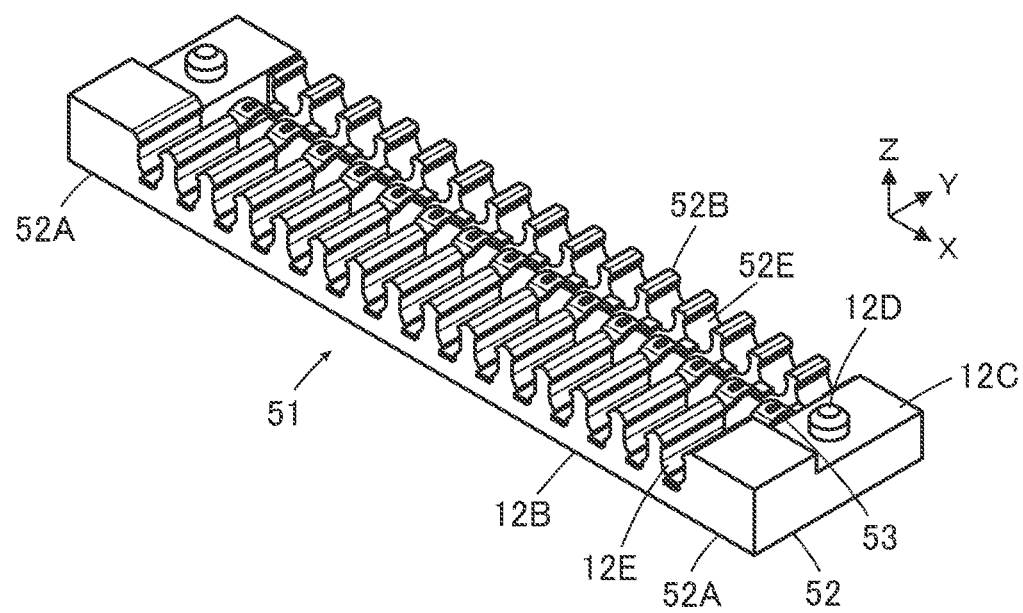
FIG. 18 is a perspective view showing a cable connection component used in Embodiment 2.

As shown in FIG. 18, the cable connection component 51 includes a locator 52 extending in the X direction and made of an insulating resin, and a plurality of metal terminals 53 attached to the locator 52.

The locator 52 includes a pair of support members 52A disposed at opposite ends in the X direction of the locator 52, the second beam 12B extending in the X direction and joining the pair of support members 52A to each other, and a first beam 52B disposed at a distance in the +Y direction from the second beam 12B, extending in the X direction, and joining the pair of support members 52A to each other.

While the pair of support members 52A of the locator 52 have a longer length in the Y direction than that of the support members 12A of the locator 12 in Embodiment 1, as with the support members 12A, the pair of support members 52A each include the substrate-mounting surface 12C extending along an XY plane and facing in the +Z direction, and the boss 12D is formed in a center part of the substrate-mounting surface 12C to project in the +Z direction.

The second beam 12B of the locator 52 is the same as the second beam 12B of the locator 12 in Embodiment 1 and includes the plurality of second insertion grooves 12E aligned in the X direction.

Further, while the first beam 52B of the locator 52 extends parallel to the second beam 12B in the X direction and has a shorter length in the Y direction than that of the second beam 12B, as with the second beam 12B, the first beam 52B includes the plurality of first insertion grooves 52E aligned in the X direction. The first insertion grooves 52E correspond to the cables 21 and the second insertion grooves 12E and each has a bottom surface of cylindrical shape conforming to the outer peripheral surface of the insulating coating portion 21B of the cable 21. In addition, as with the second insertion groove 12E, the first insertion groove 52E has a groove width and a groove depth that allow insertion of the insulating coating portion 21B of the cable 21, and is configured to be capable of restricting movement, at least in the X direction, of the cable 21 inserted in the first insertion groove 52E.

Figure 19:
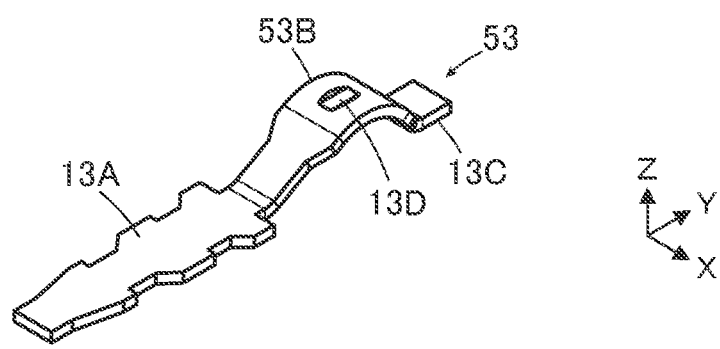
FIG. 19 is a perspective view showing a metal terminal of the cable connection component used in Embodiment 2.

The metal terminals 53 correspond to the cables 21, the second insertion grooves 12E, and the first insertion grooves 52E. As shown in FIG. 19, each metal terminal 53 includes the fixing portion 13A of flat plate shape, a curved portion 53B joined to the fixing portion 13A on its +Y direction side, and the heated portion 13C of flat plate shape joined to the curved portion 53B on its +Y direction side. In other words, the metal terminal 53 is configured such that, in the metal terminal 13 used in Embodiment 1, the curved portion 53B in place of the curved portion 13B is disposed between the fixing portion 13A and the heated portion 13C, and the conductor portion insertion groove 13D is formed on the +Z directional surface of the top part of the curved portion 53B, as with the metal terminal 13 in Embodiment 1.

Figure 20:
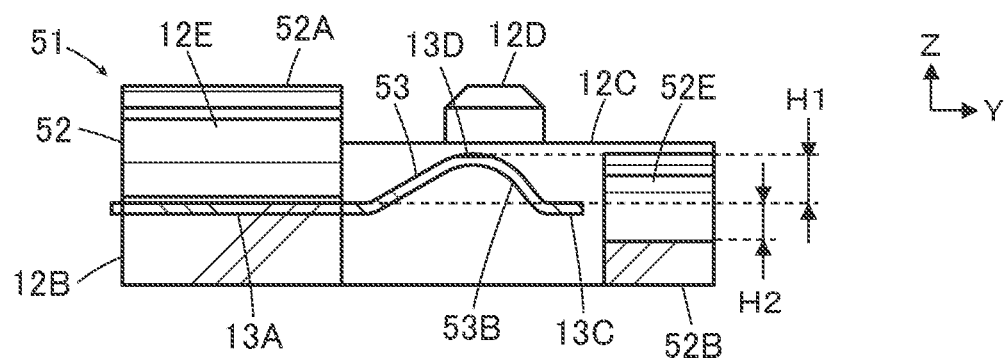
FIG. 20 is a cross-sectional view showing the cable connection component used in Embodiment 2.

As shown in FIG. 20, the metal terminal 53 has a so-called cantilever shape extending in the +Y direction from the corresponding second insertion groove 12E of the second beam 12B, and there is a height difference H1 between the curved portion 53B and the fixing portion 13A, the height difference H1 corresponding to the thickness of the insulating coating portion 21B of the cable 21. The heated portion 13C joined to the curved portion 53B on its +Y direction side is disposed at the same position in the Z direction as the fixing portion 13A.

Moreover, the first insertion groove 52E formed in the first beam 52B of the locator 52 is situated on the +Y direction side of the metal terminal 53 and is deviated in the −Z direction from the second insertion groove 12E formed in the second beam 12B so that there is a predetermined level difference H2 therebetween.

Figure 21:
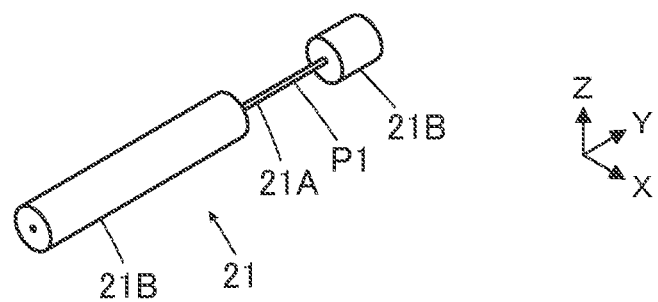
FIG. 21 is a perspective view showing a cable used in Embodiment 2.

As shown in FIG. 21, the cable 21 used in Embodiment 2 is configured such that, at a position away from the +Y directional end thereof in the −Y direction by a predetermined distance, the insulating coating portion 21B is removed to form the conductor-exposed portion P1 where the conductor portion 21A is exposed in a predetermined length in the Y direction. That is, the conductor portion 21A at the conductor-exposed portion P1 positioned on the front side from the +Y directional end of the cable 21 is exposed, and the insulating coating portion 21B is left unremoved on the +Y direction side and the −Y direction side of the conductor-exposed portion P1.

In the cable connection component 51 shown in FIG. 20, the first insertion grooves 52E formed in the first beam 52B of the locator 52 constitute the first restriction portions that separately restrict movements, at least in the X direction, of the insulating coating portions 21B at the +Y directional tip ends of the cables 21, and the second insertion grooves 12E of the second beam 12B of the locator 52 constitute the second restriction portions that separately restrict movements, at least in the X direction, of the insulating coating portions 21B at positions away from the tip ends of the cables 21 in the −Y direction, i.e., on the proximal side of the cables 21, by a predetermined distance.

Figure 22:
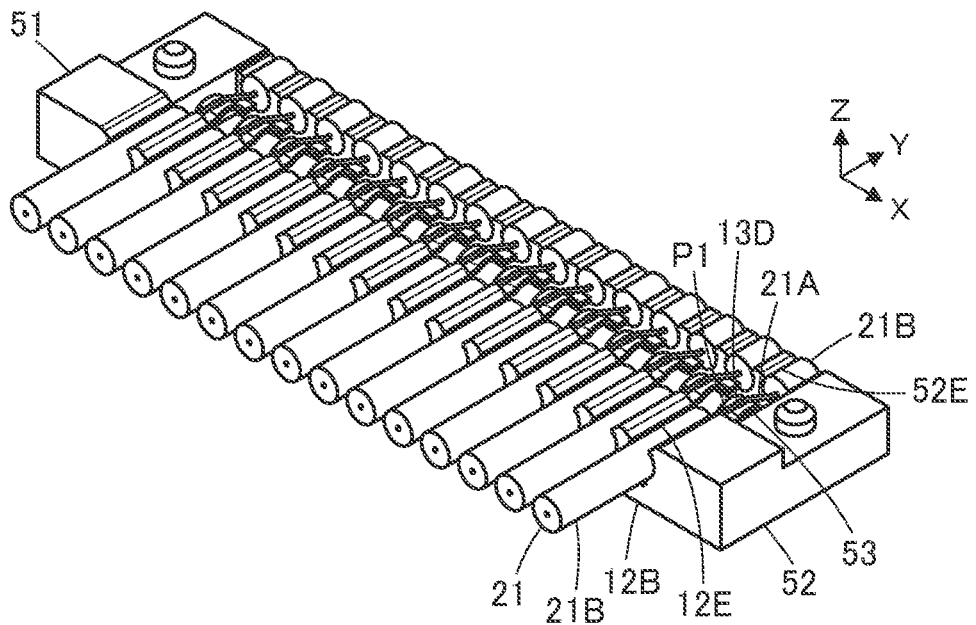
FIG. 22 is a perspective view showing the cable connection component on which a plurality of cables are disposed in Embodiment 2.

In the assembling operation of the cable structure, first, the cables 21 are disposed on the locator 52 of the cable connection component 51 as shown in FIG. 22. In this process, the insulating coating portion 21B is inserted in the corresponding first insertion groove 52E (first restriction portion) of the locator 52 at the +Y directional tip end of each cable 21, the conductor portion 21A exposed at the conductor-exposed portion P1 of the cable 21 is situated on the +Z direction side of the curved portion 53B of the corresponding metal terminal 53 and inserted in the conductor portion insertion groove 13D of the curved portion 53B, and the insulating coating portion 21B on the −Y direction side of the conductor-exposed portion P1 is inserted in the corresponding second insertion groove 12E (second restriction portion) of the locator 52.

Figure 23:
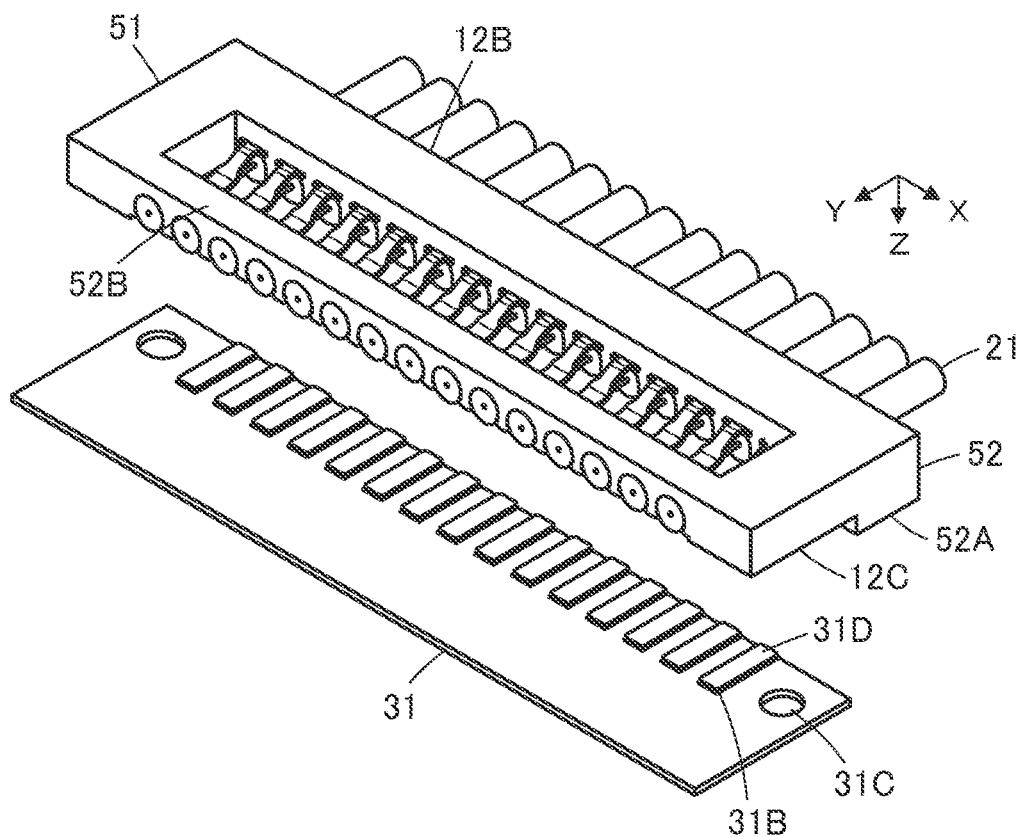
FIG. 23 is a perspective view showing a state where the substrate is positionally aligned with the cable connection component on which the cables are disposed in Embodiment 2.

Next, as shown in FIG. 23, the substrate 31 is disposed on the +Z direction side of the cable connection component 51 on which the cables 21 are disposed. With this constitution, the substrate-mounting surfaces 12C of the pair of support members 52A of the locator 52 are opposed to the −Z directional surface of the substrate 31 on which the connection portions 31B are exposed.

Meanwhile, the cream solder 31D is preliminarily printed on the connection portions 31B exposed on the −Z directional surface of the substrate 31.

Figure 24:
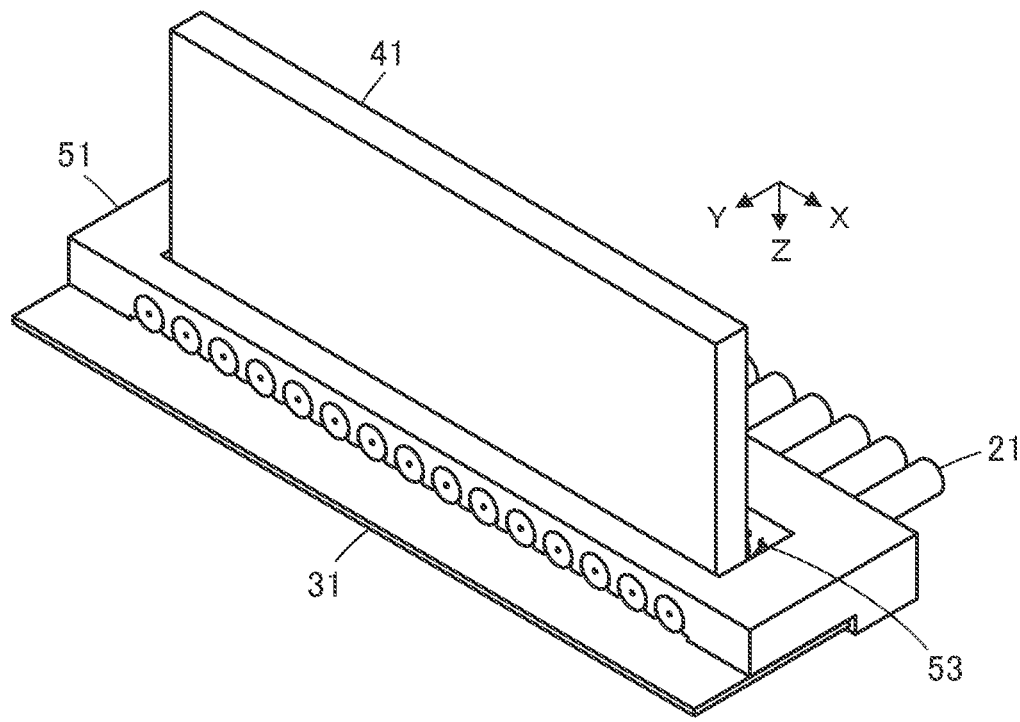
FIG. 24 is a perspective view showing a state where a heater is disposed on the cable connection component to which the cables and the substrate are disposed in Embodiment 2.

Further, the substrate 31 and the cable connection component 51 are relatively moved in the Z direction, whereby the substrate 31 is mounted on the substrate-mounting surfaces 12C of the pair of support members 52A of the locator 52, and in this state, the heater 41 is disposed on the metal terminals 53 from the −Z direction as shown in FIG. 24. The heating portion of the heater 41 makes contact with the heated portion 13C of each metal terminal 53 shown in FIG. 20.

Here, when the substrate 31 is mounted on the substrate-mounting surfaces 12C of the pair of support members 52A of the locator 52, the locator 52 is preferably fixed to the substrate 31 by a jig (not shown) such that the metal terminals 53 do not move in the −Z direction relatively to the connection portions 31B of the substrate 31.

Figure 25:
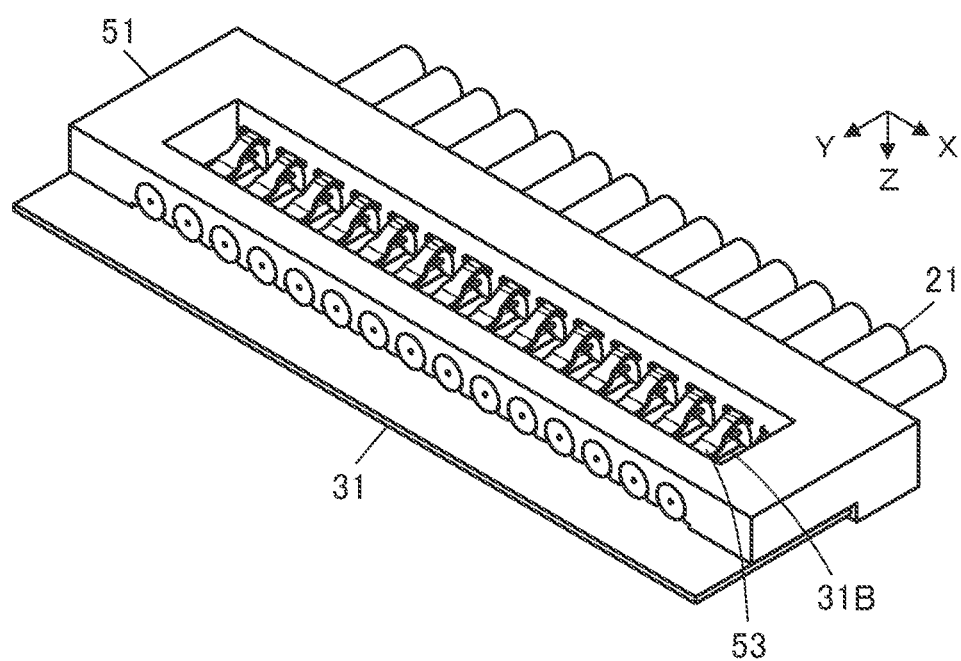
FIG. 25 is a perspective view showing a state where conductor portions of the cables are soldered to the substrate in Embodiment 2.

By applying electric current to the heater 41 from a power source (not shown) connected to the heater 41, the metal terminals 53 in contact with the heating portion are heated, the cream solder 31D printed on the connection portions 31B of the substrate 31 is melted, and the metal terminals 53 are separately soldered to the connection portions 31B of the substrate 31 as shown in FIG. 25.

Figure 26:
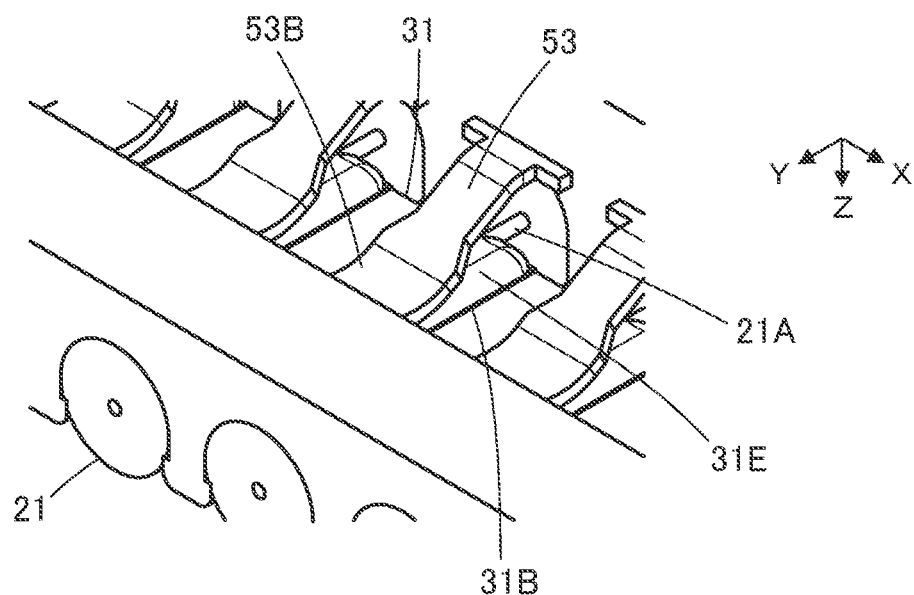
FIG. 26 is an enlarged view of a main part of FIG. 25.

In this process, as shown in FIG. 26, the conductor portion 21A of the cable 21 that is situated between the curved portion 53B of each metal terminal 53 and the corresponding connection portion 31B of the substrate 31, together with the metal terminal 53, is soldered to the connection portion 31B with the solder 31E to be thereby electrically connected to the connection portion 31B.

Thus, the assembling operation of the cable structure is completed.

Figure 27:
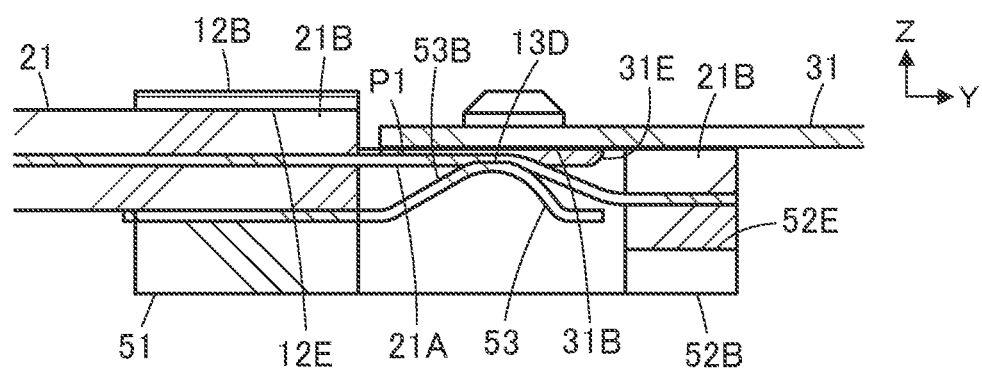
FIG. 27 is a cross-sectional view showing the cable structure according to Embodiment 2.

A cross-sectional view of the thus assembled cable structure is shown in FIG. 27. While the insulating coating portion 21B at the +Y directional tip end of the cable 21 is inserted in the first insertion groove 52E of the first beam 52B of the locator 52, and the insulating coating portion 21B on the −Y direction side of the conductor-exposed portion P1 is inserted in the second insertion groove 12E of the second beam 12B, the conductor portion 21A of the conductor-exposed portion P1 inserted in the conductor portion insertion groove 13D of the metal terminal 53 is electrically connected to the connection portion 31B of the substrate 31 with the solder 31E.

Since the conductor portion 21A of the cable 21 is inserted in the conductor portion insertion groove 13D of the curved portion 53B of the metal terminal 53, movement in the X direction of the conductor portion 21A at the conductor-exposed portion P1 is restricted, and the distance in the Z direction between the top part of the curved portion 53B and the connection portion 31B of the substrate 31 is narrowed, whereby the soldering between the metal terminal 53 and the connection portion 31B is facilitated, compared to the case where the conductor portion insertion groove 13D is not provided. Accordingly, it is possible to electrically connect the conductor portion 21A of the cable 21 to the connection portion 31B of the substrate 31 with high reliability.

As described above, owing to the first insertion groove 52E of the first beam 52B constituting the first restriction portion and the second insertion groove 12E of the second beam 12B constituting the second restriction portion, the conductor portion 21A of the cable 21 is electrically connected to the connection portion 31B of the substrate 31 while movement of the cable 21 at least in the X direction is restricted at two positions separated from each other in the Y direction, whereby the plurality of cables 21 are prevented from misalignment with respect to the plurality of connection portions 31B of the substrate 31 and can be connected to the connection portions 31B also in Embodiment 2. In addition, since the conductor portion 21A of each cable 21 is connected to the corresponding connection portion 31B of the substrate 31 with use of the metal terminal 53, the plurality of cables 21 can be connected to the substrate 31 with excellent retention strength.

Embodiment 3

Figure 28:
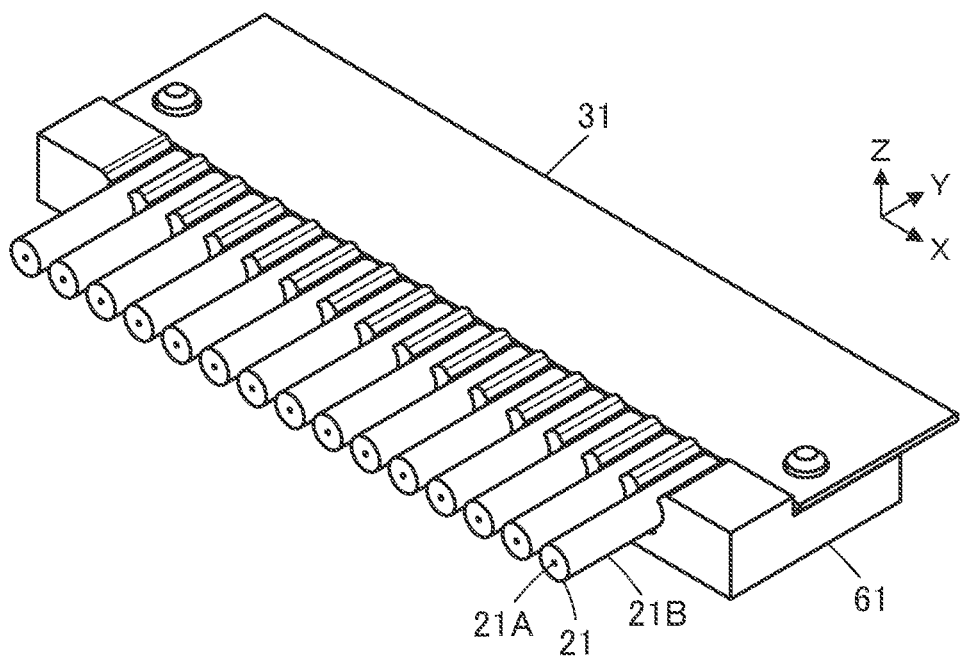
FIG. 28 is a perspective view showing a cable structure according to Embodiment 3.

FIG. 28 shows a cable structure according to Embodiment 3. The cable structure is configured such that, in the cable structure of Embodiment 2, the cables 21 are connected to the sheet type substrate 31 using a cable connection component 61 in place of the cable connection component 51. Each cable 21 has a structure in which an outer periphery of the conductor portion 21A is covered with the insulating coating portion 21B, and the substrate 31 is the same as the one used in Embodiments 1 and 2.

Figure 29:
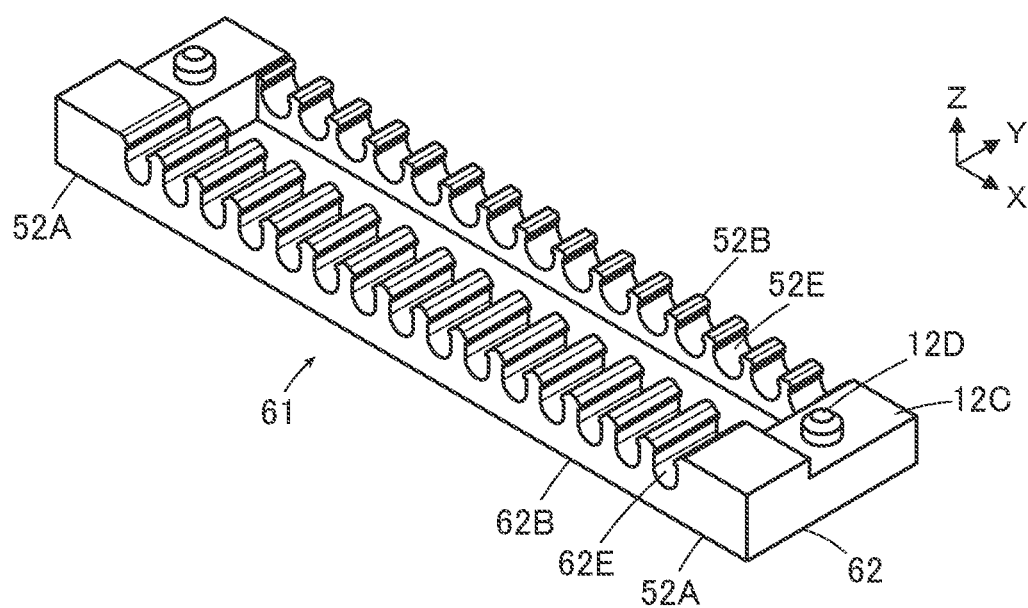
FIG. 29 is a perspective view showing a cable connection component used in Embodiment 3.

As shown in FIG. 29, the cable connection component 61 includes a locator 62 extending in the X direction and made of an insulating resin.

The locator 62 includes the pair of support members 52A disposed at opposite ends in the X direction of the locator 62, a second beam 62B extending in the X direction and joining the pair of support members 52A to each other, and the first beam 52B disposed at a distance in the +Y direction from the second beam 62B, extending in the X direction, and joining the pair of support members 52A to each other.

The pair of support members 52A of the locator 62 are the same as the pair of support members 52A of the locator 52 in Embodiment 2 and each include the substrate-mounting surface 12C extending along an XY plane and facing in the +Z direction, and the boss 12D is formed in a center part of the substrate-mounting surface 12C to project in the +Z direction.

The first beam 52B of the locator 62 is the same as the first beam 52B of the locator 52 in Embodiment 2 and includes the plurality of first insertion grooves 52E aligned in the X direction.

The second beam 62B of the locator 62 includes a plurality of second insertion grooves 62E aligned in the X direction as with the second beam 12B of the locator 52 in Embodiment 2, and each second insertion groove 62E has a bottom surface of cylindrical shape conforming to the outer peripheral surface of the insulating coating portion 21B of the cable 21.

Figure 30:
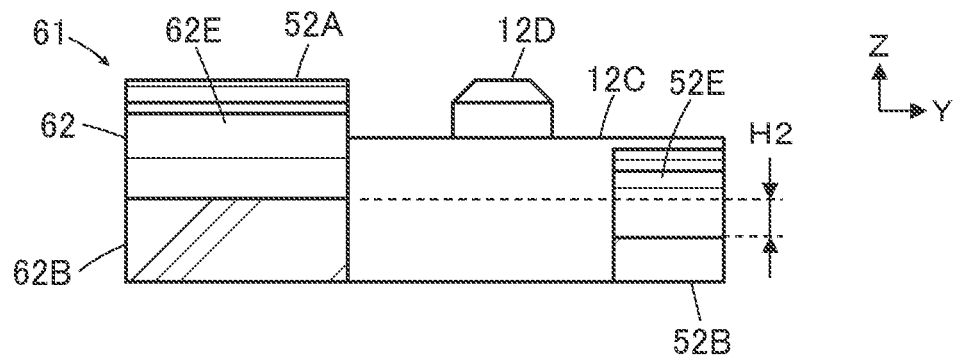
FIG. 30 is a cross-sectional view showing the cable connection component used in Embodiment 3.

As shown in FIG. 30, the first insertion groove 52E of the first beam 52B is deviated in the −Z direction from the second insertion groove 62E formed in the second beam 62B so that there is a predetermined level difference H2 therebetween.

Meanwhile, the cable connection component 61 in Embodiment 3 does not include such metal terminal as those used in Embodiments 1 and 2.

In the cable connection component 61 shown in FIG. 30, the first insertion grooves 52E formed in the first beam 52B of the locator 62 constitute the first restriction portions that separately restrict movements, at least in the X direction, of the insulating coating portions 21B at the +Y directional tip ends of the cables 21, and the second insertion grooves 62E of the second beam 62B of the locator 62 constitute the second restriction portions that separately restrict movements, at least in the X direction, of the insulating coating portions 21B of the cables 21 at positions away from the tip ends of the cables 21 in the −Y direction, i.e., on the proximal side of the cables 21, by a predetermined distance.

Figure 31:
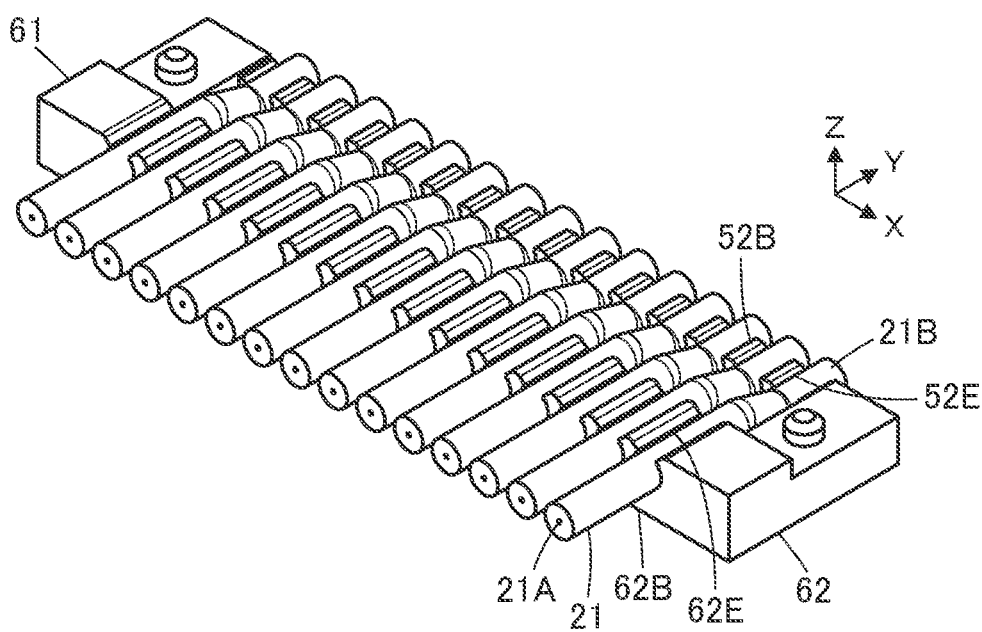
FIG. 31 is a perspective view showing the cable connection component on which a plurality of cables are disposed in Embodiment 3.

In the assembling operation of the cable structure, first, the cables 21 are disposed on the locator 62 of the cable connection component 61 as shown in FIG. 31. At this time, the cables 21 do not each include a conductor-exposed portion in which the insulating coating portion 21B is removed to expose the conductor portion 21A.

The insulating coating portion 21B at the +Y directional tip end of each cable 21 is inserted in the corresponding first insertion groove 52E (first restriction portion) of the locator 62, and at a position away from the +Y directional tip end of the cable 21 in the −Y direction by a predetermined distance, the insulating coating portion 21B is inserted in the corresponding second insertion groove 62E (second restriction portion) of the locator 62.

Figure 32:
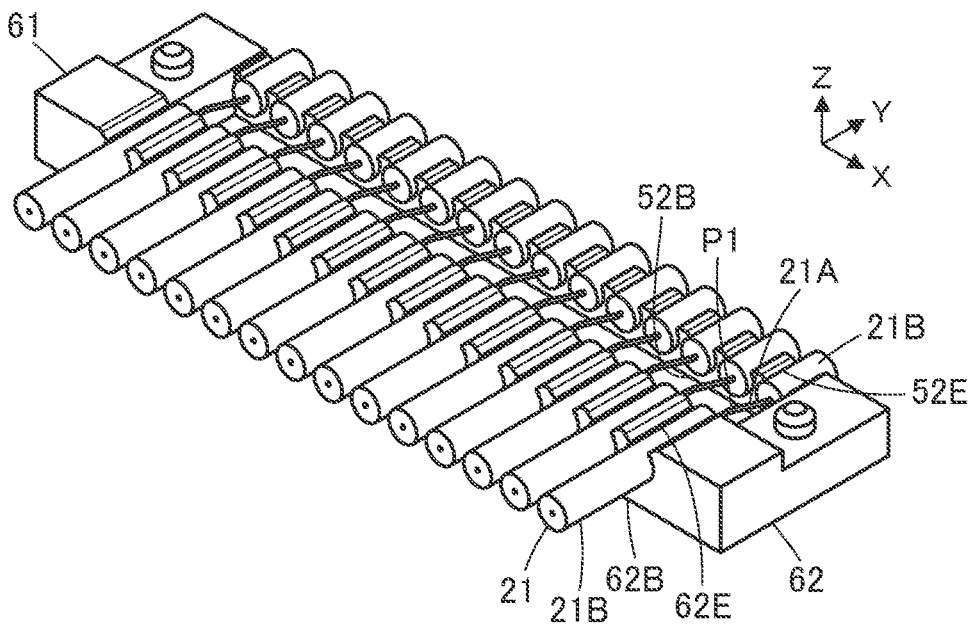
FIG. 32 is a perspective view showing a state where insulating coating portions of the cables are partly removed between a plurality of first restriction portions and a plurality of second restriction portions of the cable connection component in Embodiment 3.

In this state, a laser beam is emitted to the outer peripheral surfaces of the cables 21 between the first beam 52B and the second beam 62B of the locator 62, whereby the insulating coating portions 21B of the cables 21 are removed. Thus, the conductor-exposed portion P1 where the conductor portion 21A is exposed is formed between, of each cable 21, a portion inserted in the first insertion groove 52E of the first beam 52B and a portion inserted in the second insertion groove 62E of the second beam 62B, as shown in FIG. 32.

Figure 33:
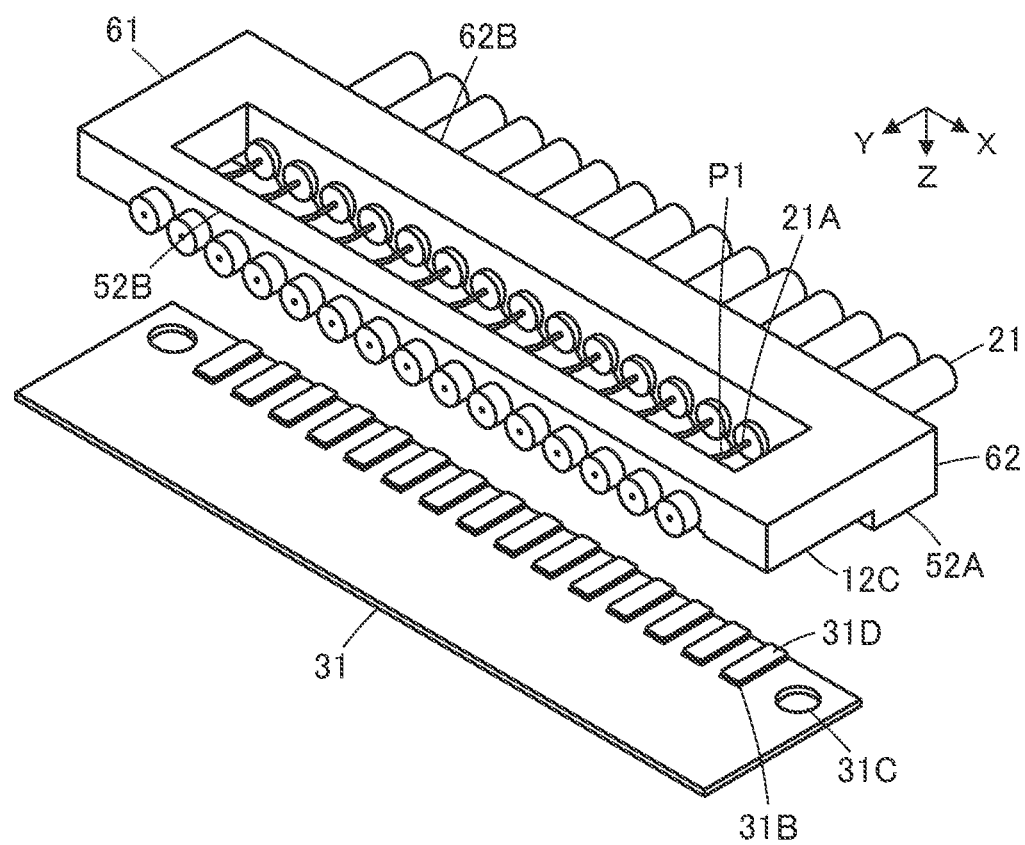
FIG. 33 is a perspective view showing a state where the substrate is positionally aligned with the cable connection component on which the cables are disposed in Embodiment 3.

Next, as shown in FIG. 33, the substrate 31 is disposed on the +Z direction side of the cable connection component 61 on which the cables 21 are disposed. With this constitution, the substrate-mounting surfaces 12C of the pair of support members 52A of the locator 62 are opposed to the −Z directional surface of the substrate 31 on which the connection portions 31B are exposed.

Meanwhile, the cream solder 31D is preliminarily printed on the connection portions 31B exposed on the −Z directional surface of the substrate 31.

Figure 34:
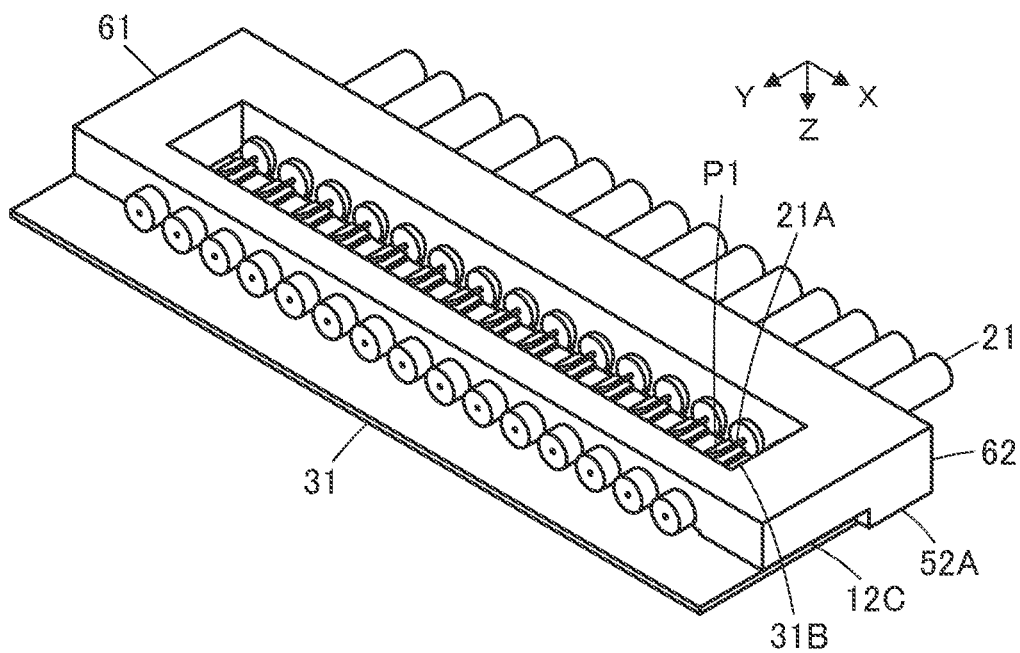
FIG. 34 is a perspective view showing a state where the substrate is disposed to the cable connection component on which the cables are disposed in Embodiment 3.

Further, the substrate 31 and the cable connection component 61 are relatively moved in the Z direction, whereby the substrate 31 is mounted on the substrate-mounting surfaces 12C of the pair of support members 52A of the locator 62 as shown in FIG. 34. With this constitution, the conductor portions 21A exposed at the conductor-exposed portions P1 of the cables 21 retained by the cable connection component 61 are situated on the −Z direction side of the connection portions 31B of the substrate 31.

Here, the locator 62 is preferably fixed to the substrate 31 by a jig (not shown) such that the conductor portions 21A exposed at the conductor-exposed portions P1 of the cables 21 do not move in the −Z direction relatively to the connection portions 31B of the substrate 31.

Figure 35:
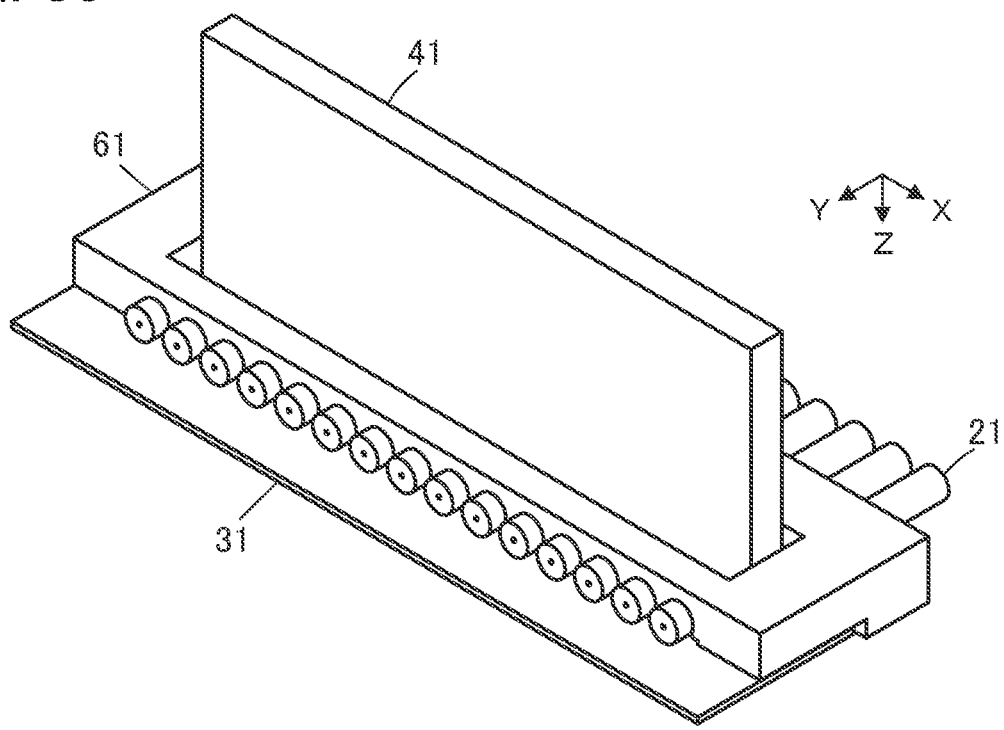
FIG. 35 is a perspective view showing a state where a heater is disposed on the cable connection component to which the cables and the substrate are disposed in Embodiment 3.

In this state, as shown in FIG. 35, the heater 41 is disposed from the −Z direction to the cable connection component 61. Although not shown in FIG. 35, the heater 41 is disposed on the conductor-exposed portions P1 of the cables 21, and the heating portion of the heater 41 makes contact with the conductor portions 21A exposed at the conductor-exposed portions P1 of the cables 21.

Figure 36:
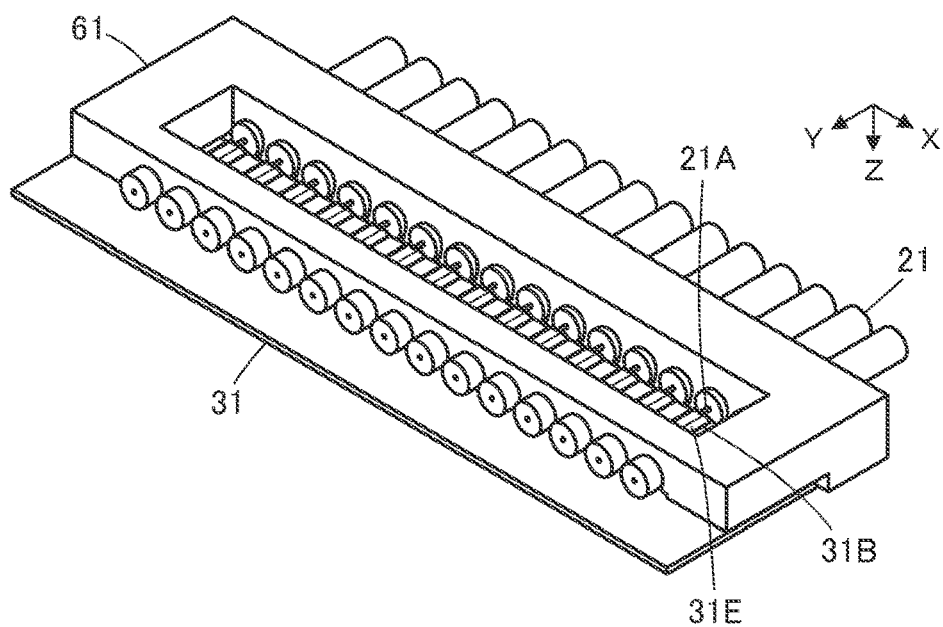
FIG. 36 is a perspective view showing a state where conductor portions of the cables are soldered to the substrate in Embodiment 3.

By applying electric current to the heater 41 from a power source (not shown) connected to the heater 41 with the heater 41 being pressed in the +Z direction, the conductor portions 21A of the cables 21 in contact with the heating portion are heated, the cream solder 31D printed on the connection portions 31B of the substrate 31 is melted, and the conductor portions 21A of the cables 21 are separately soldered to the connection portions 31B of the substrate 31 as shown in FIG. 36.

Figure 37:
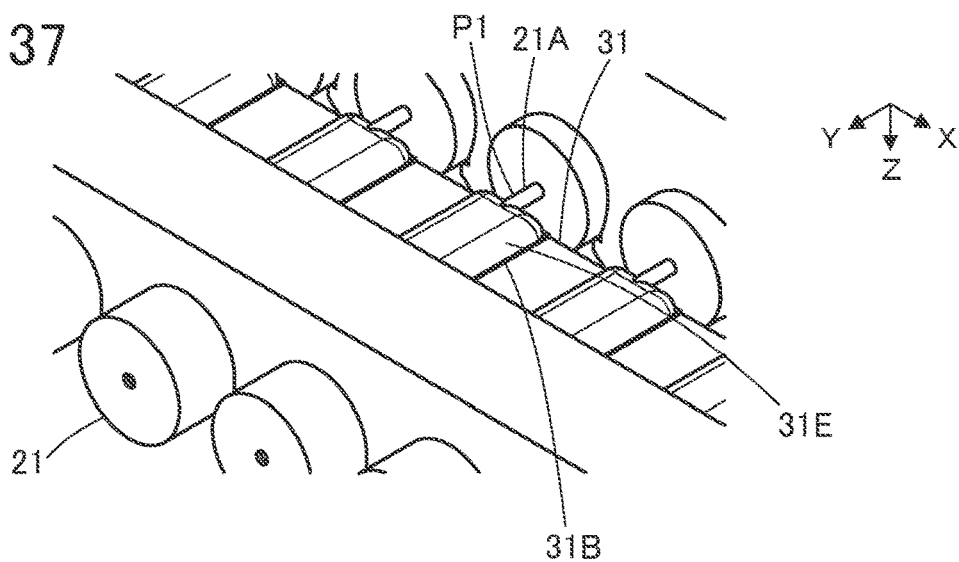
FIG. 37 is an enlarged view of a main part of FIG. 36.

In this process, as shown in FIG. 37, the conductor portion 21A exposed at the conductor-exposed portion P1 of each cable 21 is soldered to the connection portion 31B with the solder 31E to be thereby electrically connected to the connection portion 31B.

Thus, the assembling operation of the cable structure is completed.

Figure 38:
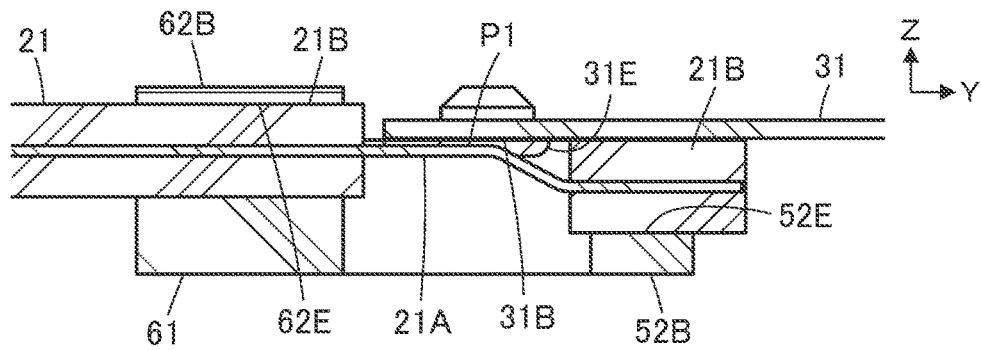
FIG. 38 is a cross-sectional view showing the cable structure according to Embodiment 3.
Figure 39:
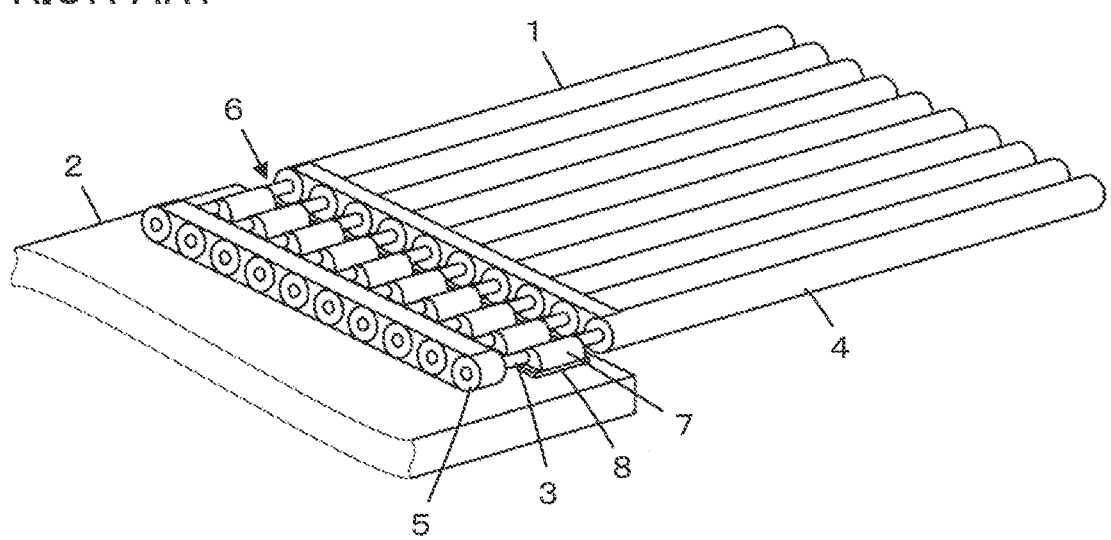
FIG. 39 is a cross-sectional view showing a conventional cable structure.

A cross-sectional view of the thus assembled cable structure is shown in FIG. 38. At the +Y directional tip end of the cable 21, the insulating coating portion 21B is inserted in the first insertion groove 52E of the first beam 52B of the locator 62, and at a position away from the +Y directional tip end of the cable 21 in the −Y direction by a predetermined distance, the insulating coating portion 21B is inserted in the second insertion groove 62E of the second beam 62B; in this state, the conductor portion 21A at the conductor-exposed portion P1 of the cable 21, which is soldered as being pressed in the +Z direction by the heater 41, is electrically connected to the connection portion 31B of the substrate 31 with the solder 31E.

As described above, owing to the first insertion groove 52E of the first beam 52B constituting the first restriction portion and the second insertion groove 62E of the second beam 62B constituting the second restriction portion, the conductor portion 21A of the cable 21 is electrically connected to the connection portion 31B of the substrate 31 while movement of the cable 21 at least in the X direction is restricted at two positions separated from each other in the Y direction, whereby the plurality of cables 21 are prevented from misalignment with respect to the plurality of connection portions 31B of the substrate 31 and can be connected to the connection portions 31B also in Embodiment 3.

In addition, since metal terminals are not used in Embodiment 3, the number of components can be reduced, and a cable structure having a simple structure can be realized.

In Embodiment 3 described above, the conductor-exposed portions P1 of the cables 21 are formed by emitting a laser beam to the outer peripheral surfaces of the cables 21 between the first beam 52B and the second beam 62B of the locator 62, but this is not the sole case. For instance, by providing a cut to the insulating coating portion 21B of each cable 21 using a cutting tool or another tool and sliding the insulating coating portion 21B toward a tip end of the cable 21, the conductor-exposed portion P1 where the conductor portion 21A is exposed can be formed.

What is claimed is:

1. A cable connection component for soldering a plurality of cables to a plurality of connection portions of a substrate, the plurality of cables being aligned in a predetermined alignment direction and having conductor portions whose outer peripheries are separately covered with insulating coating portions; the cable connection component comprising:
    a locator extending in the alignment direction;
    a plurality of first restriction portions disposed in the locator and separately restricting movements, at least in the alignment direction, of tip ends in an extension direction of the plurality of cables;
    a plurality of second restriction portions disposed in the locator and separately restricting movements, at least in the alignment direction, of the plurality of cables at positions on a proximal side of the plurality of cables away from the tip ends of the plurality of cables along the extension direction by a predetermined distance; and
    a plurality of metal terminals corresponding to the plurality of cables,
    wherein the plurality of conductor portions exposed from the plurality of cables between the plurality of first restriction portions and the plurality of second restriction portions are soldered to the plurality of connection portions of the substrate,
    wherein the locator includes a pair of support members disposed at opposite ends in the alignment direction of the locator, and a second beam extending in the alignment direction to join the pair of support members to each other, wherein the plurality of second restriction portions are constituted of a plurality of second insertion grooves which are formed and aligned in the second beam and in which the insulating coating portions of the plurality of cables are inserted, wherein the plurality of metal terminals extend in the extension direction separately from the plurality of second insertion grooves, and wherein the plurality of metal terminals separately include curved portions curved in a perpendicular direction orthogonal to the alignment direction and the extension direction, and conductor portion insertion grooves which are separately formed in the curved portions and in which the conductor portions of the corresponding cables are inserted.

2. The cable connection component according to claim 1, wherein the plurality of first restriction portions are separately constituted of the conductor insertion grooves.

3. The cable connection component according to claim 1, wherein the plurality of metal terminals separately include conductor portion insertion holes or conductor portion insertion slits which are formed at tip ends in the extension direction of the plurality of metal terminals and in which the conductor portions of the corresponding cables are inserted, and the plurality of first restriction portions are separately constituted of the conductor portion insertion holes or the conductor portion insertion slits.

4. The cable connection component according to claim 1, wherein the locator includes a first beam disposed at a distance in the extension direction from the second beam, extending in the alignment direction, and joining the pair of support members to each other, and the plurality of first restriction portions are constituted of a plurality of first insertion grooves which are formed and aligned in the first beam and in which the insulating coating portions at the tip ends of the plurality of cables are inserted.

5. The cable connection component according to claim 4, wherein there is a predetermined level difference in the perpendicular direction between the plurality of first insertion grooves and the plurality of second insertion grooves.

6. The cable connection component according to claim 1, wherein the plurality of metal terminals separately include fixing portions jointed to the curved portions and fixed to bottom parts of the corresponding second insertion grooves, and there is a height difference in the perpendicular direction between the curved portion and the fixing portion, the height difference corresponding to a thickness of the insulating coating portion.

7. The cable connection component according to claim 1, wherein the plurality of metal terminals separately include heated portions formed at tip ends in the extension direction of the metal terminals and making contact with a heater used for soldering the conductor portions of the corresponding cables to the substrate.

8. The cable connection component according to claim 1, wherein the locator includes a first beam disposed at a distance in the extension direction from the second beam, extending in the alignment direction, and joining the pair of support members to each other, and the plurality of first restriction portions are constituted of a plurality of first insertion grooves which are formed and aligned in the first beam and in which the insulating coating portions at the tip ends of the plurality of cables are inserted.

9. The cable connection component according to claim 8, wherein there is a predetermined level difference in the perpendicular direction between the plurality of first insertion grooves and the plurality of second insertion grooves.

10. A cable structure comprising:

a plurality of the cables aligned in the alignment direction and having the conductor portions whose outer peripheries are separately covered with the insulating coating portions;

the substrate including the plurality of connection portions aligned in the alignment direction; and the cable connection component according to claim 1, wherein the plurality of conductor portions exposed from the plurality of cables between the plurality of first restriction portions and the plurality of second restriction portions are soldered to the plurality of connection portions of the substrate.

* * * * *